(12) United States Patent
Azadet et al.

(10) Patent No.: US 9,778,902 B2
(45) Date of Patent: Oct. 3, 2017

(54) SOFTWARE DIGITAL FRONT END (SOFTDFE) SIGNAL PROCESSING

(71) Applicant: Intel Corporation, Santa Clara, CA (US)

(72) Inventors: Kameran Azadet, Pasadena, CA (US); Chengzhou Li, Whitehall, PA (US); Albert Molina, Novelda (ES); Joseph H. Othmer, Ocean, NJ (US); Steven C. Pinault, Allentown, PA (US); Meng-Lin Yu, Morganville, NJ (US); Joseph Williams, Holmdel, NJ (US); Ramon Sanchez Perez, Galapagar (ES); Jian-Guo Chen, Basking Ridge, NJ (US)

(73) Assignee: Intel Corporation, Santa Clara, CA (US)

( * ) Notice: Subject to any disclaimer, the term of this patent is extended or adjusted under 35 U.S.C. 154(b) by 416 days.

(21) Appl. No.: 13/701,374

(22) PCT Filed: Oct. 26, 2012

(86) PCT No.: PCT/US2012/062179
§ 371 (c)(1),
(2) Date: Apr. 24, 2013

(87) PCT Pub. No.: WO2013/066756
PCT Pub. Date: May 10, 2013

(65) Prior Publication Data
US 2014/0086356 A1    Mar. 27, 2014

Related U.S. Application Data

(60) Provisional application No. 61/552,242, filed on Oct. 27, 2011.

(51) Int. Cl.
*G06F 5/01* (2006.01)
*G06F 17/15* (2006.01)
(Continued)

(52) U.S. Cl.
CPC .............. *G06F 5/01* (2013.01); *G06F 9/3001* (2013.01); *G06F 9/30036* (2013.01);
(Continued)

(58) Field of Classification Search
CPC ........ H04B 1/0003; G06F 17/15; H03H 17/06
See application file for complete search history.

(56) References Cited

U.S. PATENT DOCUMENTS 5,953,241 A * 9/1999 Hansen ..................... G06F 9/30
375/E7.268
2003/0110197 A1* 6/2003 Hansen ................. G06F 7/5334
708/620

(Continued)

FOREIGN PATENT DOCUMENTS

CN    101563851 A    10/2009
EP    2 256 937       12/2010
(Continued)

OTHER PUBLICATIONS

European Patent Office Extended European Search Report for application No. 12846556.4-1852/2772033 PCT/US2012062179, mailed Jun. 24, 2015, 8 pages.
(Continued)

*Primary Examiner* — Chuong D Ngo
(74) *Attorney, Agent, or Firm* — Barnes & Thornburg LLP

(57) ABSTRACT

Software Digital Front End (SoftDFE) signal processing techniques are provided. One or more digital front end (DFE) functions are performed on a signal in software by executing one or more specialized instructions on a proces-
(Continued)

sor to perform the one or more digital front end (DFE) functions on the signal, wherein the processor has an instruction set comprised of one or more of linear and non-linear instructions. A block of samples comprised of a plurality of data samples is optionally formed and the digital front end (DFE) functions are performed on the block of samples. The specialized instructions can include a vector convolution function, a complex exponential function, an $x^k$ function, a vector compare instruction, a vector max( ) instruction, a vector multiplication instruction, a vector addition instruction, a vector sqrt( ) instruction, a vector 1/x instruction, and a user-defined non-linear instruction.

34 Claims, 21 Drawing Sheets

(51) Int. Cl.

| | | |
|---|---|---|
| *G06F 9/30* | (2006.01) | |
| *H03H 17/06* | (2006.01) | |
| *H04B 1/04* | (2006.01) | |
| *H04L 1/00* | (2006.01) | |
| *H04L 27/233* | (2006.01) | |
| *H04B 1/62* | (2006.01) | |
| *H04L 25/02* | (2006.01) | |
| *H04L 25/03* | (2006.01) | |
| *H03M 3/00* | (2006.01) | |
| *H03F 1/02* | (2006.01) | |
| *H03F 1/32* | (2006.01) | |
| *H03F 3/189* | (2006.01) | |
| *H03F 3/24* | (2006.01) | |
| *H04L 25/49* | (2006.01) | |
| *H04B 1/00* | (2006.01) | |

(52) U.S. Cl.
CPC ............ *G06F 17/15* (2013.01); *H03F 1/0288* (2013.01); *H03F 1/3241* (2013.01); *H03F 1/3258* (2013.01); *H03F 3/189* (2013.01); *H03F 3/24* (2013.01); *H03H 17/06* (2013.01); *H03M 3/30* (2013.01); *H04B 1/0475* (2013.01); *H04B 1/62* (2013.01); *H04L 1/0054* (2013.01); *H04L 25/02* (2013.01); *H04L 25/03* (2013.01); *H04L 25/03178* (2013.01); *H04L 25/03216* (2013.01); *H04L 25/4917* (2013.01); *H04L 27/2334* (2013.01); *H03F 2200/336* (2013.01); *H03F 2201/3209* (2013.01); *H03F 2201/3212* (2013.01); *H03F 2201/3224* (2013.01); *H03F 2201/3233* (2013.01); *H04B 1/0003* (2013.01); *H04B 2001/0408* (2013.01)

(56) References Cited

U.S. PATENT DOCUMENTS

| | | | |
|---|---|---|---|
| 2007/0005674 A1 | 1/2007 | Sazegari | |
| 2007/0087770 A1 | 4/2007 | Gan | |
| 2008/0107046 A1 | 5/2008 | Kangasmaa et al. | |
| 2009/0245406 A1 | 10/2009 | Moffatt | |
| 2010/0124257 A1* | 5/2010 | Yahya | 375/219 |
| 2010/0144333 A1 | 6/2010 | Kiasaleh | |
| 2011/0255011 A1* | 10/2011 | Gu et al. | 348/731 |
| 2013/0007082 A1* | 1/2013 | Elenes | 708/304 |
| 2013/0022157 A1* | 1/2013 | Hollevoet et al. | 375/343 |

FOREIGN PATENT DOCUMENTS

| | | |
|---|---|---|
| JP | 2006-279780 A | 10/2006 |
| WO | WO 2011101233 | 8/2011 |

OTHER PUBLICATIONS

Notice of Reasons for Rejection and English Translation for Japanese Application No. 2014-539057, dated Jun. 14, 2016, 4 pages.
First Office Action for Chinese Application No. 201280060788.4, dated May 31, 2016, 7 pages.
English Translation for First Office Action for Chinese Application No. 201280060788.4, dated May 31, 2016, 11 pages.
Office Action and English Translation for Chinese Patent Application No. 201280060788.4, dated Feb. 3, 2017, 14 pages.
Chinese Patent Office Action for application No. 201280060788.4, dated Jul. 11, 2017, 5 pages.

* cited by examiner

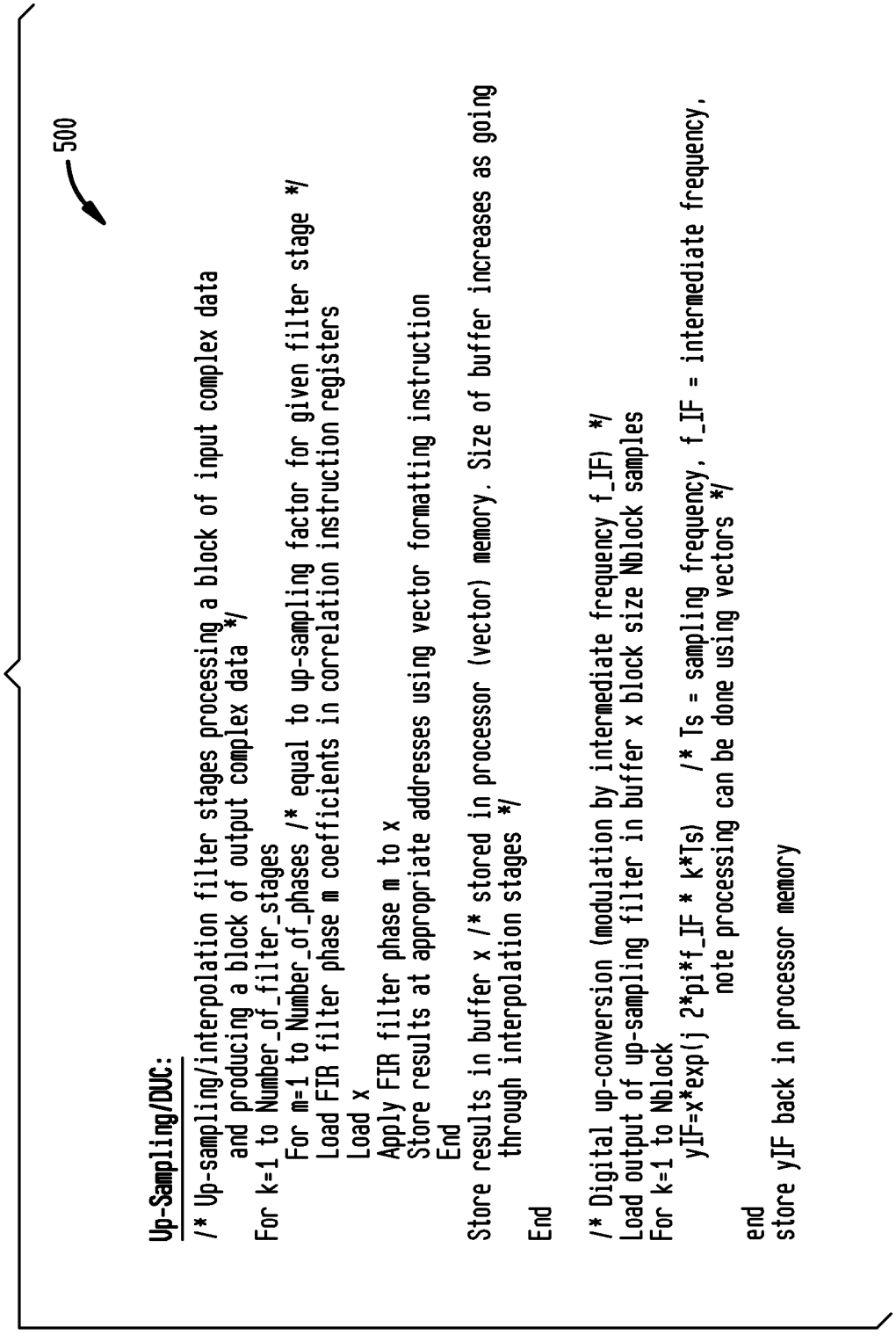

FIG. 5

Up-Sampling/DUC:
/* Up-sampling/interpolation filter stages processing a block of input complex data
   and producing a block of output complex data */
For k=1 to Number_of_filter_stages
    For m=1 to Number_of_phases /* equal to up-sampling factor for given filter stage */
        Load FIR filter phase m coefficients in correlation instruction registers
        Load x
        Apply FIR filter phase m to x
        Store results at appropriate addresses using vector formatting instruction
    End
Store results in buffer x /* stored in processor (vector) memory. Size of buffer increases as going
   through interpolation stages */
End /* Digital up-conversion (modulation by intermediate frequency f_IF) */
Load output of up-sampling filter in buffer x block size Nblock samples
For k=1 to Nblock
    yIF=x*exp(j 2*pi*f_IF * k*Ts)   /* Ts = sampling frequency, f_IF = intermediate frequency,
                                       note processing can be done using vectors */
end
store yIF back in processor memory

SOFTWARE DIGITAL FRONT END (SOFTDFE) SIGNAL PROCESSING

CROSS-REFERENCE TO RELATED APPLICATIONS

The present application claims priority to U.S. Patent Provisional Application Ser. No. 61/552,242, filed Oct. 27, 2011, entitled "Software Digital Front End (SoftDFE) Signal Processing and Digital Radio," incorporated by reference herein.

FIELD OF THE INVENTION

The present invention is related to digital signal processing techniques and, more particularly, to techniques for digital front end processing in communication devices

BACKGROUND OF THE INVENTION

In communication systems, the term "front-end" originally described the analog portion of a receiver or transmitter in proximity with the antenna. The front-end delivered an analog signal at an intermediate frequency (IF) to a back-end for digital processing. More recently, the term "front-end" has been extended to include some of the signal conditioning previously performed in the analog domain to digital processing components in more recent terminal or base-station systems.

A digital front end (DFE) is now a generic term for the circuitry between the BB processor and analog baseband/RF circuits. In the receiver, the DFE comprises the components that process the RF demodulated digitized signal, which may or may not contain an intermediate frequency (depending on whether the receiver is zero IF or non-zero IF). On the receiver side, the DFE extracts from the digital IF signal different channels (GSM, WCDMA, LTE or a combination of these technologies) at various IF frequencies digitally (operation used to be performed in the analog domain in previous generation systems).

In the transmitter, the DFE comprises the components that process the baseband signal for various channels in the digital domain and provide an up-converted digital signal. This up-converted signal may further undergo additional signal conditioning such as crest factor reduction and digital pre-distortion of RF power amplifier non-linear response, and is finally applied to a digital-to-analog converter (DAC).

A digital front end is typically implemented using hard-wired logic due to the high sampling rates of the above mentioned multi-carrier multi-standard radio signals. While such hardware-based DFE techniques effectively process a communication signal, they suffer from a number of limitations, which if overcome, could further improve the efficiency and flexibility of DFE systems. For example, existing hardware-based DFE techniques lack flexibility and it is expensive, time consuming and challenging to modify the DFE design for a new RF design, as design of a DFE ASIC (Application Specific Integrated Circuit) is costly and time consuming (often a cycle of two years).

A number of techniques have been proposed or suggested for implementing portions of a DFE system in software. For example, portions of the DFE are implemented on a field-programmable gate array (FPGA) while other portions of the DFE are hardwired and other portions implemented in an ASIC. FPGAs contain programmable logic components called "logic blocks." FPGA-based techniques, however, are prohibitive in terms of cost and power consumption.

Implementation of various DFE functions in software is possible. However, for existing sampling rates of hundreds of Megahertz, for example, a real-time DFE software implementation is not achievable on standard digital signal processors or even vector processors. A need therefore exists for efficient software-based DFE techniques.

SUMMARY OF THE INVENTION

Generally, software Digital Front End (SoftDFE) signal processing techniques are provided. According to one aspect of the invention, one or more digital front end (DFE) functions are performed on a signal in software by executing one or more specialized instructions on a processor to perform the one or more digital front end (DFE) functions on the signal, wherein the processor has an instruction set comprised of one or more of linear and non-linear instructions. The processor can be, for example, a digital signal processor or a vector processor.

The specialized instructions can include a vector convolution function that receives an input vector of N1+N2−1 samples and processes time shifted versions of N1 samples of the input vector N1 and coefficients, and for each time shifted-version produces an FIR output value. In addition, the specialized instructions can include a complex exponential function and/or an $x^k$ function for a vector, x.

The signal can be processed sample-by-sample or as a block of data samples. According to a further aspect of the invention, a block of samples is formed comprised of a plurality of data samples and the digital front end (DFE) functions are performed on the block of samples.

For an exemplary channel filtering DFE function, the specialized instructions comprise a vector convolution function. For an exemplary digital up conversion DFE function, the specialized instructions comprise a complex exponential instruction.

For an exemplary crest factor reduction DFE function, the specialized instructions for (i) a peak detection comprise one or more of a vector compare instruction and a vector max( ) instruction; (ii) a peak cancellation comprise one or more of a vector multiply-accumulate instruction, vector multiplication instruction and a vector addition instruction; and (iii) a polar clipping operation comprise one or more of a vector $x^{-0.5}$ instruction, a vector sqrt( )instruction and vector 1/x instruction.

For an exemplary digital pre-distortion DFE function, the specialized instructions comprise one or more user-defined non-linear instructions. The user-defined non-linear instructions comprise at least one user-specified parameter. In response to at least one of the software instructions for at least one non-linear function having at least one user-specified parameter, the following steps are performed: (i) invoking at least one functional unit that implements the at least one software instruction to apply the non-linear function to an input value, x; and (ii) generating an output corresponding to the non-linear function for the input value, x. The user-specified parameter can be loaded from memory into at least one register. The user-specified parameter comprises, for example, a look-up table storing values of the non-linear function for a finite number of input values.

A more complete understanding of the present invention, as well as further features and advantages of the present invention, will be obtained by reference to the following detailed description and drawings.

BRIEF DESCRIPTION OF THE DRAWINGS

FIG. 5 illustrates exemplary pseudo code for the channel filter and digital up conversion stage;

DETAILED DESCRIPTION

Figure 1:
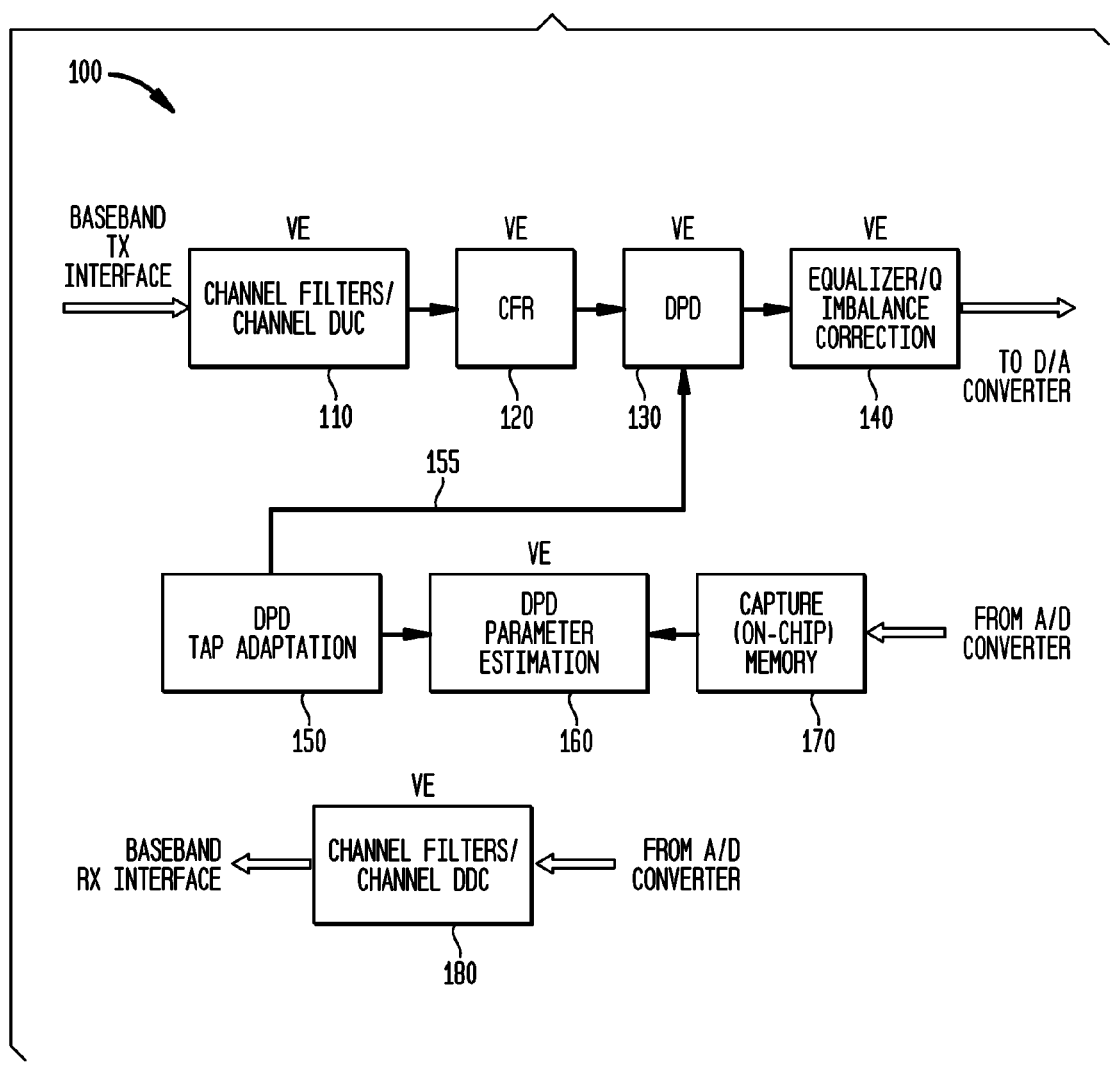
FIG. 1 illustrates portions of an exemplary communication system in which aspects of the present invention may be employed.

FIG. 1 illustrates portions of an exemplary communication system 100 in which aspects of the present invention may be employed. As shown in FIG. 1, the exemplary communication system 100 comprises a transmit portion having a channel filter and digital up conversion (DUC) stage 110, a crest factor reduction (CFR) stage 120, a digital pre-distortion (DPD) stage 130 and an equalization/IQ imbalance correction 140. Generally, as discussed further below in conjunction with FIGS. 3-5, the channel filter and digital up conversion stage 110 performs channel filtering using, for example, finite impulse response (FIR) filters and digital up conversion to convert a digitized baseband signal to a radio frequency (RF). As discussed further below in conjunction with FIGS. 6-10, the crest factor reduction stage 120 limits the PAR of the transmitted signal. As discussed further below in conjunction with FIGS. 11-15, the digital pre-distortion stage 130 linearizes the power amplifier to improve efficiency. As discussed further below in conjunction with FIG. 19, the equalization/IQ imbalance correction 140 performs IQ correction and employs RF channel equalization to mitigate channel impairments.

Figure 16:
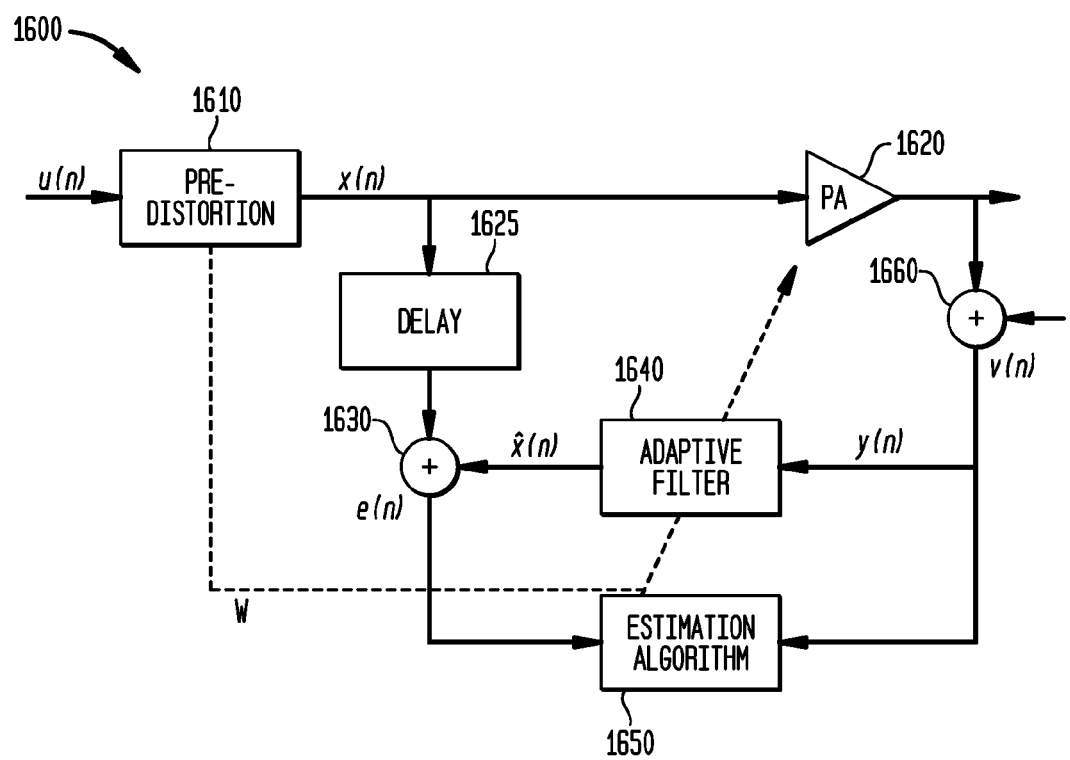
FIG. 16 is a schematic diagram of a first system for adaptive pre-distortion.

As shown in FIG. 1, the digital signal from the analog-to-digital converter (ADC) is stored in an on-chip memory 170 for DPD parameter estimation 160, as discussed further below in conjunction with FIGS. 16 and 17. The DPD taps are then adapted at stage 150, for example, using a central processing unit (CPU), a general purpose processor (GPP) digital signal processor (DSP) or a vector processor.

As shown in FIG. 1, the exemplary communication system 100 also comprises a receive portion having channel filters/channel digital down conversion (DDC) block 180 that receives a signal from an analog-to-digital converter (ADC) and provides a baseband signal to an RX interface.

According to one aspect of the invention, one or more of the blocks of the digital front end (DFE) of the communication system 100 of FIG. 1 are implemented in software. As discussed hereinafter, these SoftDFE blocks take either individual samples or block of samples to produce up-sampled and up-converted samples and output samples (typically a block of samples). One or more of the SoftDFE functions are implemented in software using specialized features of vector processors. It is noted that the processing of different antenna data can be performed in different vector processors. In addition, different SoftDFE functions can be processed in different vector processors or in the same vector processor.

Figure 2:
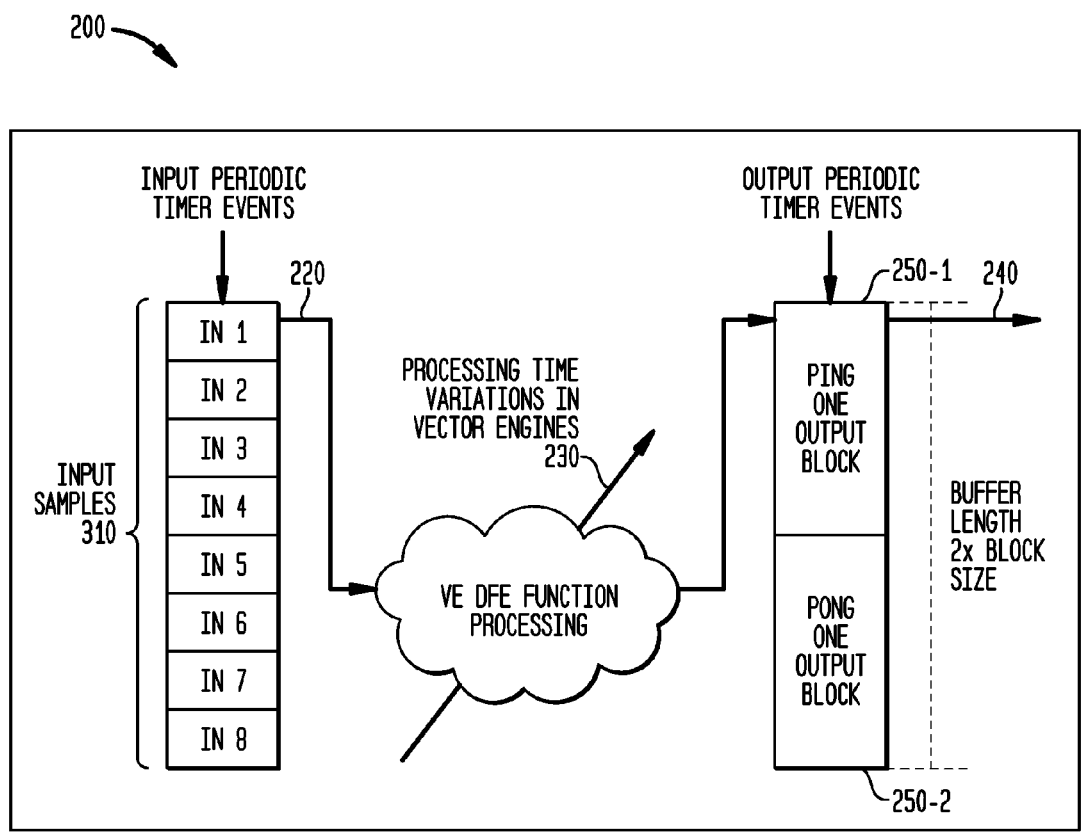
FIG. 2 illustrates a block generation process that converts individual data samples to blocks of data.

FIG. 2 illustrates a block generation process 200 that converts individual data samples 210 to blocks of data 250. As shown in FIG. 2, individual data samples 210 are read in using input periodic timer events 220. As shown by 230, processing time can vary in processors, such as a vector engine (VE). As indicated above, block processing in accordance with aspects of the present invention allows latency to be maintained, independent of process load. Thus, blocks of data 250 are read out using output periodic timer events 240.

The data blocks 250 are optionally stored in a buffer. In one exemplary implementation, two data blocks 250 can be stored in the buffer at a time. Thus, the buffer has a size of at least two block lengths.

Channel Filter and Digital Up Conversion Stage 110

As indicated above, the channel filter and digital up conversion stage 110 performs channel filtering using, for example, finite impulse response (FIR) filters and digital up conversion to convert a digitized baseband signal to a radio frequency (RF). As discussed hereinafter, one or more functions of the channel filter and digital up conversion stage 110 are implemented in software on one or more vector processors accelerated using either vector multiplication, vector addition and reduction, or alternatively, a vector convolution instruction. Digital up conversion, for example, requires multiplying the input signal by a complex exponential (vector multiplication, i.e. component wise product of two vectors, the signal and rotator vector) and an aspect of the present invention employs an accelerated complex exponential function. Digital modulation is optionally performed using a numerically controlled oscillator (NCO) based on the complex exponential (computed as a vector).

Figure 3:
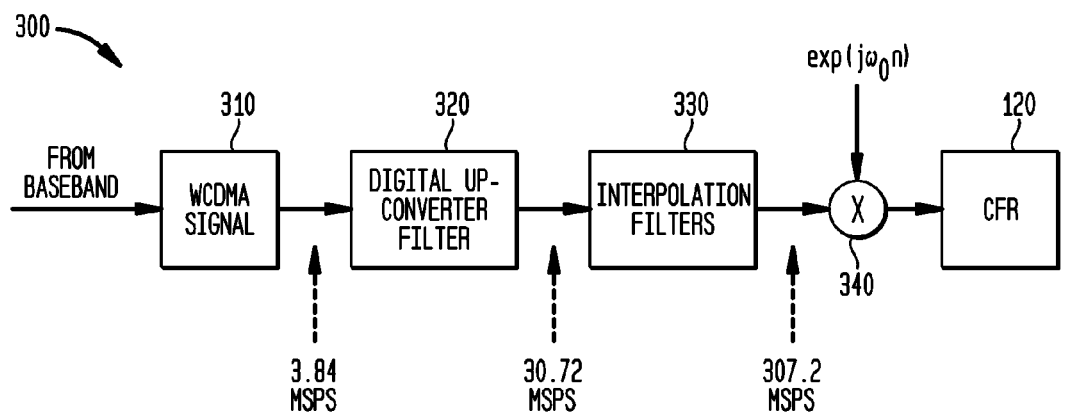
FIG. 3 is a schematic block diagram of an exemplary channel filter and digital up conversion stage that can be used to implement block of FIG. 1.

FIG. 3 is a schematic block diagram of an exemplary channel filter and digital up conversion stage 300 that can be used to implement block 110 of FIG. 1. As shown in FIG. 3, the exemplary channel filter and digital up conversion stage 300 comprises an exemplary WCDMA signal 310, for example, having an exemplary sampling rate of 3.84 megasamples-per-second (MSPS) (or a signal of another exemplary technology in a multi-standard radio (MSR). The WCDMA signal 310 is then applied to digital up-converter filters 320, as discussed further below in conjunction with FIG. 4A, to up-convert the signal to an exemplary sampling rate of 30.72 MSPS. The up-converted signal is then applied to interpolation filters 330, as discussed further below in conjunction with FIG. 4B, that further up-convert the signal to an exemplary sampling rate of 307.2 MSPS.

The output of the interpolation filters 330 is applied to a multiplier 340 and multiplied by a complex exponential function $\exp(j\omega_0 n)$ For a more detailed discussion of the complex exponential function $\exp(j\omega_0 n)$, see, International Patent Application Serial No. PCT/US12/62191, entitled "Digital Processor Having Instruction Set With Complex Exponential Non-Linear Function," filed contemporaneously herewith and incorporated by reference herein.

The various channels are then aggregated and applied to the CFR 120 of FIG. 1

Figure 4A:
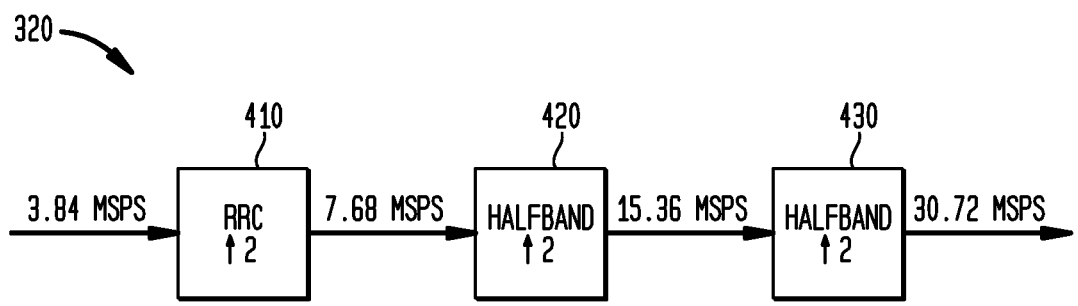
FIG. 4A is a schematic block diagram of the digital up-converter filters of FIG. 3.

FIG. 4A is a schematic block diagram of the digital up-converter filters 320 of FIG. 3. As shown in FIG. 4A, the digital up-converter filters 320 comprise a Root Raised Cosine (RRC) filter 410 that performs a factor-of-2 up-sampling, two halfband filters 420, 430, that each perform a factor-of-2 up-sampling.

The following table describes an exemplary implementation of the filters 410, 420, 430 of FIG. 4A:

| Filter Stage | Input Rate MHz | Output Rate MHz | Number Of Taps | Bit Width | Comment Filter Type |
|---|---|---|---|---|---|
| Stage 1 (410) | 3.84 | 7.68 | 125 | 14 | Root Raised Cosine |
| Stage 2 (420) | 7.68 | 15.36 | 31 | 18 | Half-Band |
| Stage 3 (430) | 15.36 | 30.72 | 15 | 16 | Half-Band |

The present invention recognizes that the filtering operations described herein, including the filtering operations of filters 410, 420, 430 can be accelerated using a vector convolution function, discussed further below in conjunction with FIG. 18. See also, International Patent Application Serial No. PCT/US2012/062182, entitled "Vector Processor Having Instruction Set With Vector Convolution Function For FIR Filtering," filed contemporaneously herewith and incorporated by reference herein.

Figure 4B:
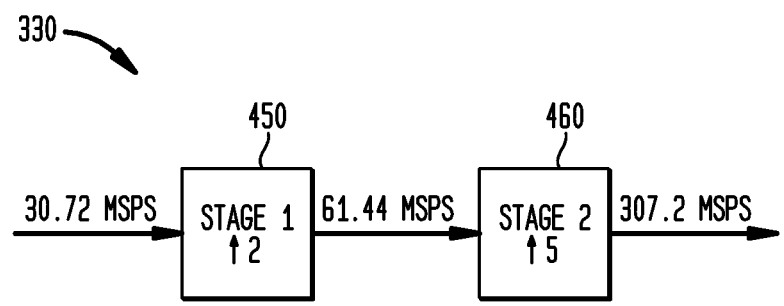
FIG. 4B is a schematic block diagram of the interpolation filters of FIG. 3.

FIG. 4B is a schematic block diagram of the interpolation filters 330 of FIG. 3. As shown in FIG. 4B, the interpolation filters 330 comprise two filters 450, 560. Filter 450 performs a factor-of-2 up-sampling and filter 460 performs a factor-of-5 up-sampling, for a total up-sampling ratio of 10.

The following table describes an exemplary implementation of the filters 450, 460 of FIG. 4B:

| Filter Stage | Input Rate (MHz) | Output Rate (MHz) | Number Of Taps | Bit Width | Filter Type |
|---|---|---|---|---|---|
| Stage 1 (450) | 30.72 | 61.44 | 29 | 16 | HBF |
| Stage 2 (460) | 61.44 | 307.42 | 45 5 Poly-phase banks with each bank consisting of 9 taps | 16 | M-th band Nyquist Filter. Being M-th band (M = 5), every $5^{th}$ sample is zero. This implies only 4 poly-phase banks need to be processed and the $5^{th}$ poly-phase bank is just an impulse tap in the middle. |

FIG. 5 illustrates exemplary pseudo code 500 for the channel filter and digital up conversion stage 110. The exemplary pseudo code 500 processes a block of input complex data and produces a block of output complex data. A loop is processed for each filter stage to perform up-sampling and interpolation filtering. In addition, digital up-conversion (modulation by intermediate frequency f_IF) is performed for the block of samples.

Crest Factor Reduction Stage 120

As indicated above, the crest factor reduction stage 120 limits the PAR of the transmitted signal. As discussed hereinafter, the crest factor reduction requires peak detection and peak cancellation. The peak detection can leverage a vector compare instruction or a specialized max( )instruction. Likewise, peak cancellation involves multiplication and additions of vectors, and hard clipping involves envelope computation (vector sqrt( )and vector (x*conj(x)) comparing to a threshold and scaling (1/x for a vector component wise) which can be accelerated using a vector processor. The sqrt( )and 1/x operations can additionally be combined and performed using a vector $x^{-0.5}$ operation/instruction.

Figure 6:
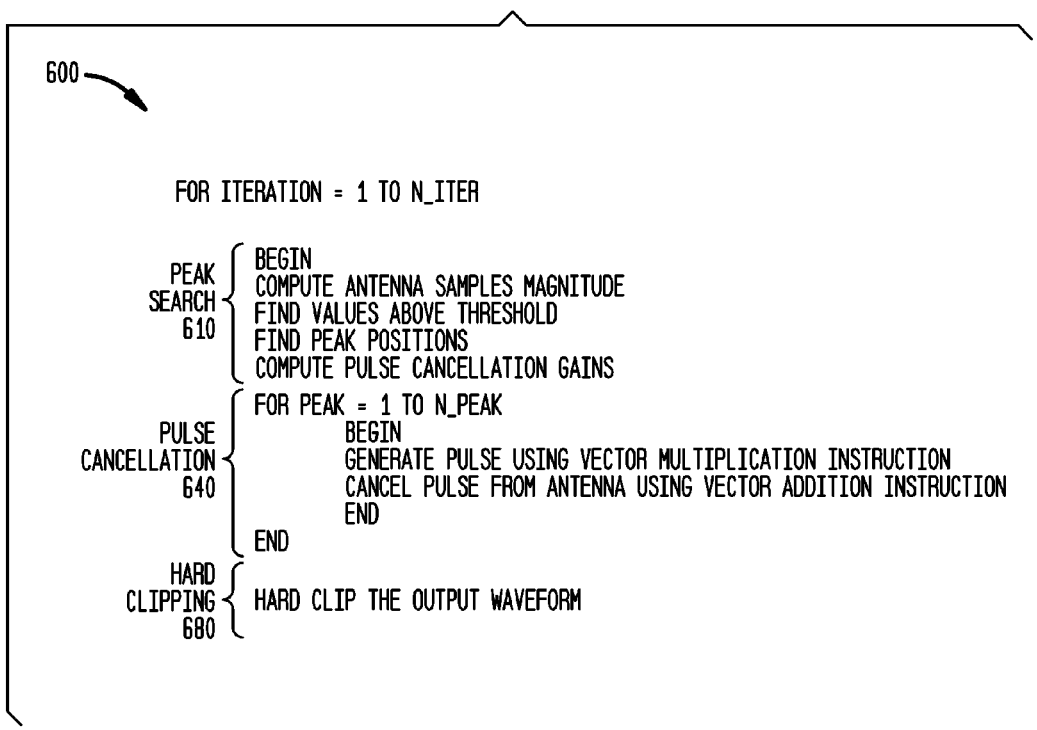
FIG. 6 illustrates exemplary pseudo code for a suitable Crest Factor Reduction algorithm that can be employed by the crest factor reduction stage of FIG. 1.

FIG. 6 illustrates exemplary pseudo code 600 for a suitable Crest Factor Reduction algorithm that can be employed by the crest factor reduction stage 120 of FIG. 1. It is noted that any alternative Crest Factor Reduction algorithm could also be employed. As shown in FIG. 6, the exemplary Crest Factor Reduction algorithm 600 comprises three parts, namely a peak search phase 610, a pulse cancellation phase 640 and a hard clipping phase 680.

The exemplary Crest Factor Reduction algorithm 600 can optionally be performed iteratively to address peak regrowth. For example, a number of iterations, N_iter, can have a typical value between 1 and 4. Generally, peak regrowth results when new peaks are introduced when canceling other peaks, due to the ringing on both sides of the pulse (the pulse is traditionally designed as a linear phase symmetrical FIR filter with a plurality of taps). There are taps on both sides of the center tap. Thus, peaks can be introduced in current or past sample values. In order to address the peaks introduced in past samples, existing CFR algorithms requires multiple iterations to cancel all peaks.

During the peak search phase 610, a search is conducted through the signal to determine the number of peaks, their locations and the magnitudes above the threshold level. The exemplary Crest Factor Reduction algorithm 600 initially computes the antenna samples magnitude. The sample values above a threshold are then identified. For example, the threshold can be established based on the PAR target. Thereafter, the peak positions can be identified, for example, using a vector max( )instruction. The peak detection can optionally leverage a vector compare instruction or a specialized vector max( )instruction.

During the pulse cancellation phase 640, the cancellation pulses are arranged at each of the peaks, then all of the pulses are subtracted from the peaks. The exemplary Crest Factor Reduction algorithm 600 computes the pulse cancellation gains (e.g., threshold divided by magnitude of the detected peaks). Thereafter, the exemplary Crest Factor Reduction algorithm 600 enters a loop to separately process each peak. For each peak, a pulse is generated, for example, using a vector multiplication instruction, and then the pulse is cancelled from the antenna, for example, using a vector addition instruction. Peak cancellation involves multiplication and additions of vectors, which can be accelerated on a vector processor.

During the hard clipping phase 680, the exemplary Crest Factor Reduction algorithm 600 hard clips the output waveform, for example, using non-linear operations for magnitude inverse. The clipping threshold level R is set based on the PAR target. The hard clipping may be performed, for example, using a polar clipping technique. Generally, polar clipping involves computing |x|, comparing |x| to a threshold R and scaling by R/|x|. If |x| greater than R, x is replaced by R. Again 1/|x| can be efficiently computed on a vector processor using a vector $x^{-0.5}$ operation/instruction.

In a further variation, crest factor reduction can be performed in the frequency domain.

As indicated above, one aspect of the present invention recognizes that CFR processing can be performed on blocks of data to improve efficiency. For example, a vector engine (VE) can be employed to perform CFR on blocks of data. For example, in a software implementation, block processing allows latency to be maintained constant, independent of processor load. In addition, in a software implementation, block processing improves efficiency by amortizing the overhead over an entire block of data and not just individual data samples 310.

Figure 7:
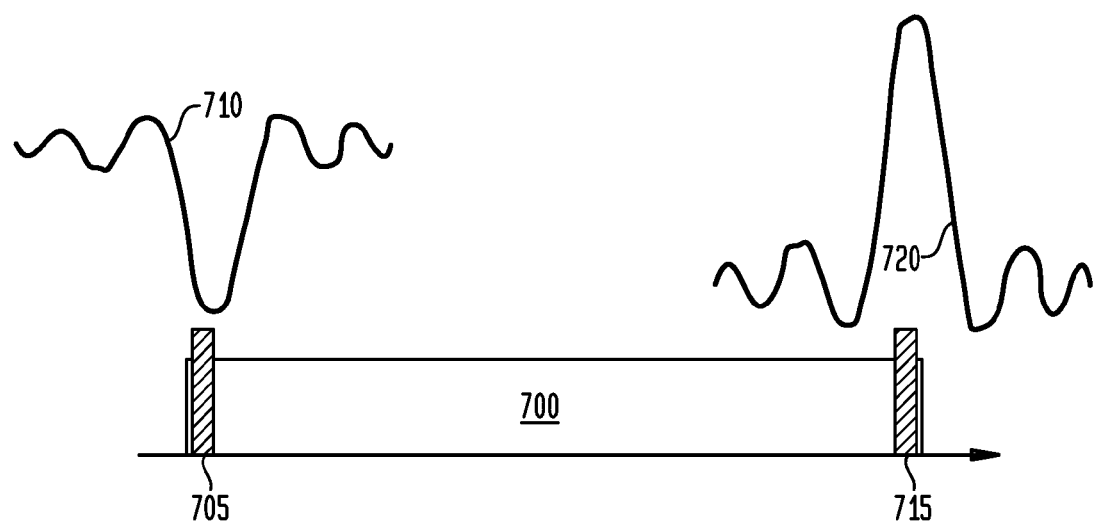
FIG. 7 illustrates block processing Crest Factor Reduction in accordance with an embodiment of the invention.

FIG. 7 illustrates block processing Crest Factor Reduction in accordance with an embodiment of the invention. As shown in FIG. 7, a block of data 700 can be applied to the Crest Factor Reduction algorithm 600 of FIG. 6. If a peak, such as peaks 705, 715, are detected near the edge of the block 700, however, there will be edge effects when the taps of the corresponding cancellation pulse 710, 720 extend outside of the block of data 400.

Figure 8:
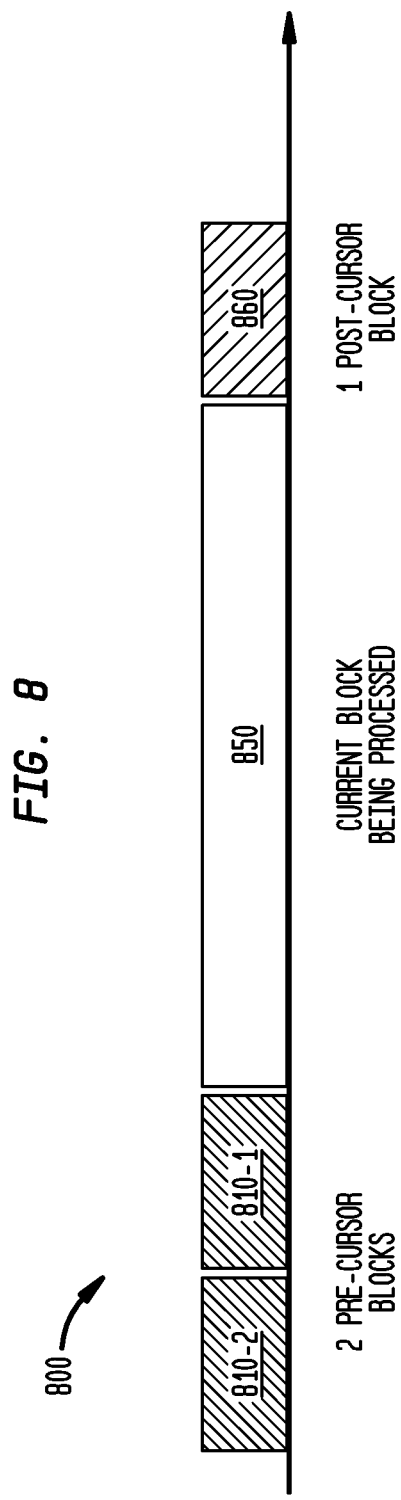
FIG. 8 illustrates block processing for Crest Factor Reduction in accordance with an embodiment of the invention.

Thus, according to another aspect of the invention, continuity of processing between blocks of data is ensured using one or more pre-cursor and/or post-cursor block samples. FIG. 8 illustrates block processing 800 for Crest Factor Reduction in accordance with an embodiment of the invention. As shown in the exemplary embodiment of FIG. 8, before being applied to the exemplary Crest Factor Reduction algorithm 600 of FIG. 6, two pre-cursors 810-1. 810-2 are placed in front of a current block 850 being processed and a single post-cursor block 860 is appended at the end of the current block 850. In this manner, the beginning and end of block 850 can be processed without introducing edge effects that would otherwise be caused by the block processing.

In one exemplary embodiment, the size of each cursor block 810. 860 is selected to be approximately equal to the size of half of a cancellation pulse 710, 720. In addition, to maintain an appropriate amount of overhead, the size of each data block 850 should be considerably larger than the size of each cursor block 810, 860. Generally, the larger the size of each data block 850, the larger the required memory and the higher the latency.

The pre-cursor blocks 810 are populated with input data from the end of the prior data block and the post-cursor block 860 is populated with input data from the beginning of subsequent data block.

In one exemplary embodiment, peaks are detected and canceled in the block 850 and in the first pre-cursor block 810-1, and not in the post-cursor block 860 because post-cursor data will be processed during the processing of the next block. The post-cursor input samples associated with the post-cursor block 860 are only need to cancel peaks inside the block 850.

In addition, when canceling a peak at the left edge of the block 850, peak re-growth occurs in the first pre-cursor block 810-1. Thus, in order to cancel these new peaks in the first pre-cursor block 510-1, the second pre-cursor block 810-2 is needed (but no cancellation is performed in the second pre-cursor block 810-2.

Figure 9:
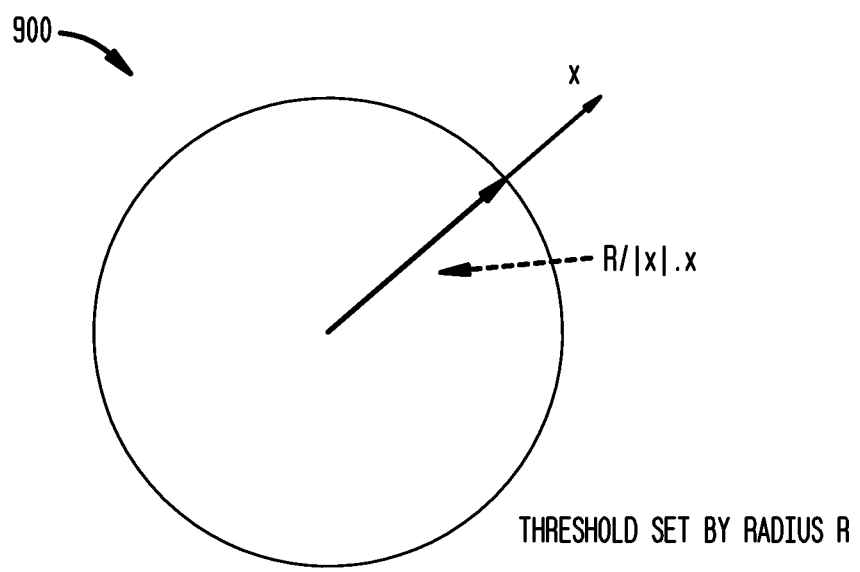
FIG. 9 illustrates an exemplary hard clipping phase of the crest factor reduction algorithm of FIG. 6.

FIG. 9 illustrates an exemplary hard clipping phase 680 of the crest factor reduction algorithm 600 of FIG. 6. As indicated above, during the hard clipping phase 680, the exemplary crest factor reduction algorithm 600 hard clips the output waveform, for example, using non-linear operations for magnitude inverse. The clipping threshold level R is set based on the peak-to-average ratio (PAR) target. The hard clipping may be performed, for example, using a polar clipping acceleration technique, as shown in FIG. 9. Generally, polar clipping involves computing |x|, comparing |x| to a threshold R (set by the radius) and scaling by R/|x|. If |x| is greater than R, x is replaced by R.

Hard clipping involves envelope computation (vector sqrt( )and vector (x*conj(x)) comparing to a threshold and scaling (1/x for a vector component wise) which can be accelerated using a vector processor. These complex multiplications can be accelerated using vector multipliers as well as a vector square root operation.

In addition, aspects of the present invention recognize that 1/|x| can directly be computed using $(x^*conj(x))^{-0.5}$, which can be accelerated using a specialized vector $x^k$ (vec_x_pow_k) instruction.

Figure 10:
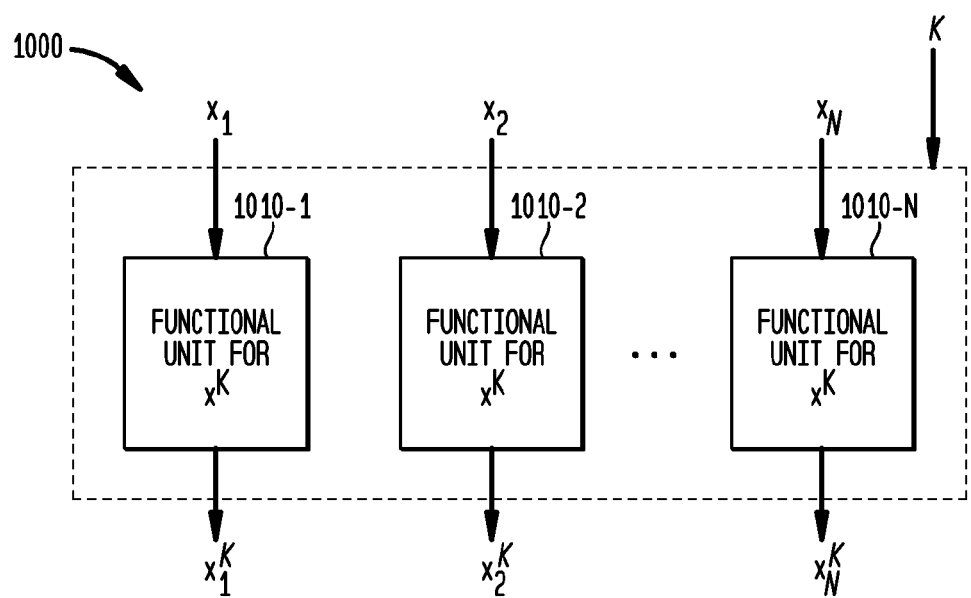
FIG. 10 is a schematic block diagram of an exemplary vector-based digital signal processor that processes one or more numbers simultaneously in accordance with an embodiment of the present invention.

FIG. 10 is a schematic block diagram of an exemplary vector-based digital signal processor 1000 that processes one or more numbers simultaneously in accordance with an embodiment of the present invention. Generally, the vector-based implementation of FIG. 10 performs a number of processes concurrently. Thus, the vector-based digital signal processor 1000 contains plural functional units for $^K$ functions 1010-1 through 1010-N.

The input to the vector-based digital signal processor 1000 is a vector, x, comprised of a plurality of scalar numbers, $x_n$, that are processed in parallel. For example, assume a vector-based digital signal processor 1000 supports an $x^K$ function for a vector, x, where X is comprised of scalar numbers $x_1$ through $x_4$. The exemplary $x^K$ function may be expressed as follows:

Pow_vec4($x_1, x_2, x_3, x_4, K$).

See also U.S. patent application Ser. No. 12/362,874, filed Jan. 30, 2009, entitled "Digital Signal Processor Having Instruction Set with an $x^k$ Function Using Reduced Look-Up Table," incorporated by reference herein.

The exemplary vector-based digital processor 1000 can be implemented as a 16-way vector processor to compute 32 $x^K$ operations using a pow(x, K) instruction implemented as:

vec_pow($x_1, x_2, \ldots, x_{32}, K$), where K values are for example 0.5, −0.5, −1.

In this manner, the vector-based digital processor 1000 can perform 16 such operations and combine them in a single cycle.

Digital Pre-Distortion Stage 130

As indicated above, the digital pre-distortion stage 130 linearizes the power amplifier to improve efficiency. As discussed hereinafter, digital pre-distortion involves computing non-linear functions for a vector. The non-linear functions could be a polynomial or another basis function. This can be accelerated using non-linear instructions that combine a look-up table and Taylor series.

The digital pre-distortion stage 130 of FIG. 1 can be implemented as follows.

Figure 11:
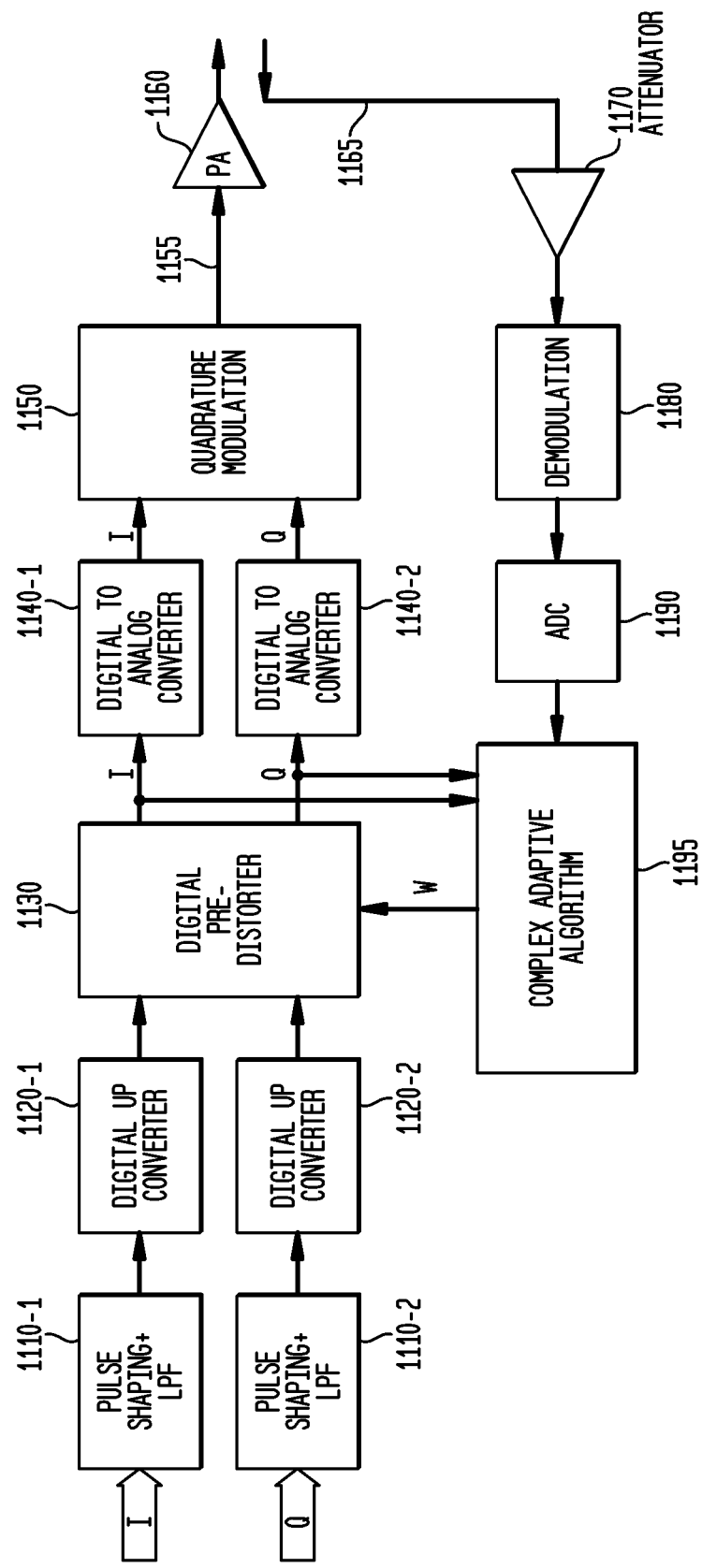
FIG. 11 illustrates portions of an alternate exemplary transmitter in which aspects of the present invention may be employed.

FIG. 11 illustrates portions of an alternate exemplary transmitter 1100 in which aspects of the present invention may be employed. As shown in FIG. 11, the exemplary transmitter portion 1100 comprises two pulse shaping and low pass filter (LPF) stages 1110-1, 1110-2 and two digital up-converters 1120-1, 1120-2 which process a complex signal I, Q. The exemplary transmitter portion 1100 of FIG. 11 does not include the crest factor reduction stage 120 of FIG. 1, but a CFR stage could optionally be included. The complex input (I,Q) is then applied to a digital pre-distorter 1130 of FIG. 11. The digital pre-distorter 1130 of FIG. 11 is discussed further below, for example, in conjunction with FIGS. 12 and 13.

The output of the digital pre-distorter 1130 is applied in parallel to two digital to analog converters (DACs) 1140-1, 1140-2, and the analog signals are then processed by a quadrature modulation stage 1150 that further up converts the signals to an RF signal.

The output 1155 of the quadrature modulation stage 1150 is applied to a power amplifier 1160, such as a Doherty amplifier or a drain modulator. As indicated above, the digital pre-distorter 1130 linearizes the power amplifier 1160 to improve the efficiency of the power amplifier 1160.

In a feedback path 1165, the output of the power amplifier 1160 is applied to an attenuator 1170 before being applied to a demodulation stage 1180 that down converts the signal to baseband. The down converted signal is applied to an analog to digital converter (ADC) 1190 to digitize the signal. The digitized samples are then processed by a complex adaptive algorithm 1195 that generates parameters w for the digital pre-distorter 1130. The complex adaptive algorithm 1195 is outside the scope of the present application. Known techniques such as least squares (LS) or recursive least squares (RLS) can be employed to generate the parameters for the digital pre-distorter 1130.

Non-Linear Filter Implementation of Digital Pre-Distorter

A digital pre-distorter 1130 can be implemented as a non-linear filter using a Volterra series model of non-linear systems. The Volterra series is a model for non-linear behavior in a similar manner to a Taylor series. The Volterra series differs from the Taylor series in its ability to capture "memory" effects. The Taylor series can be used to approximate the response of a non-linear system to a given input if the output of this system depends strictly on the input at that particular time (static non-linearity). In the Volterra series, the output of the non-linear system depends on the input to the system at other times. Thus, the Volterra series allows the "memory" effect of devices to be captured.

Generally, a causal linear system with memory can be expressed as:

$$y(t) = \int_{-\infty}^{\infty} h(\tau) x(t-\tau) d\tau$$

In addition, a static weakly non-linear system without memory can be modeled using a polynomial expression:

$$y(t) = \Sigma_{k=1}^{\infty} a_k [x(t)]^k$$

The Volterra series can be considered as a combination of the two:

$$y(t) = \Sigma_{k=1}^{K} y_k(t)$$

$$y_k(t) = \int_{-\infty}^{\infty} \ldots \int_{-\infty}^{\infty} h_k(\tau_1, \ldots, \tau_k) x(t-\tau_1) \ldots x(t-\tau_k) d\tau_1 \ldots d\tau_k$$

In the discrete domain, the Volterra Series can be expressed as follows:

$$y(n) = \Sigma_{k=1}^{K} y_k(n)$$

$$y_k(n) = \Sigma_{m_1=0}^{M-1} \ldots \Sigma_{m_k=0}^{M-1} h_k(m_1, \ldots, m_k) \Pi_{l=1}^{k} x(n-m_l)$$

The complexity of a Volterra series can grow exponentially making its use impractical in many common applications, such as DPD. Thus, a number of simplified models for non-linear systems have been proposed. For example, a memory polynomial is a commonly used model:

$$y_{MP}(n) = \sum_{k=1}^{K} \sum_{m=0}^{M-1} h_k(m, \ldots, m) x^k(n-m)$$

$$= \sum_{k=0}^{K-1} \sum_{m=0}^{M-1} h_{km} x(n-m) |x(n-m)|^k$$

Another simplified model referred to as a Generalized Memory Polynomial Model, can be expressed as follows (where M indicates the memory depth and K indicates the polynomial order):

$$y(n) = \sum_{m=0}^{M-1} \sum_{l=0}^{M-1} \sum_{k=0}^{K-1} h_{k,m,l} |x(n-1)|^k x(n-m)$$

$$y(n) = \sum_{m=0}^{M-1} \sum_{l=0}^{M-1} x(n-m) \sum_{k=0}^{K-1} h_{k,m,l} |x(n-1)|^k$$

An equivalent expression of the Generalized Memory Polynomial with cross-products. can be expressed as follows:

$$y(n) = \sum_{m=0}^{M-1} \sum_{l=0}^{M-1} x(n-m) \cdot f_{m,l}(|x(n-l)|) \quad (1)$$

where:

$$f_{m,l}(|x(n-l)|) = \sum_{k=0}^{K-1} h_{k,m,l} |x(n-1)|^k \quad (2)$$

where f(x) is a non-linear function having one or more user-specified parameters assumed to be accelerated in accordance with an aspect of the invention using the user-defined non-linear instruction vec_nl, discussed below. It is noted that other basis functions other than $x^k$ for non-linear decomposition are possible.

As discussed hereinafter, the user-defined non-linear instruction $f_{m,l}$ can be processed, for example, by a vector processor. The $f_{m,l}$ is an m×l array of non-linear functions. Each non-linear function can have a user-specified parameter, such as a look-up table or coefficients. The look-up table can be a polynomial approximation of the user-defined non-linear instruction $f_{m,l}$. As discussed further below in conjunction with FIG. 15, the look-up table for each user-defined non-linear instruction $f_{m,l}$ in the m×l array can be stored in memory and loaded into a register associated with a functional unit when the instruction is processed by the processor. The input samples can then be evaluated on the individual non-linear instruction $f_{m,l}$ in the m×l array.

Figure 12:
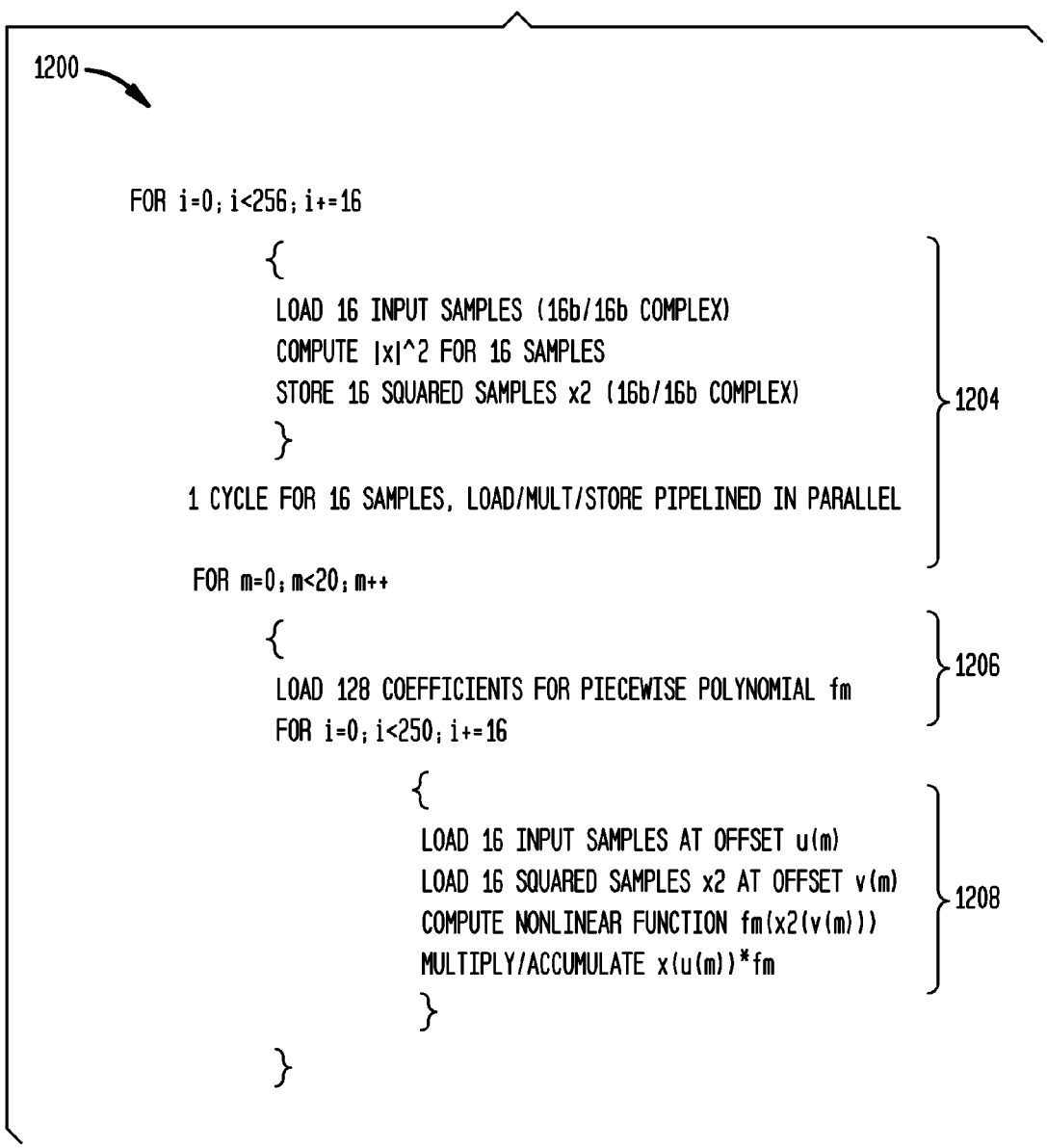
FIG. 12 illustrates exemplary pseudo code to implement a DPD function in software on a vector processor using a user-defined non-linear instruction $f_{m,l}$.

FIG. 12 illustrates exemplary pseudo code 1200 to implement a DPD function in software on a vector processor of 16 component vectors using a user-defined non-linear instruction $f_{m,l}$ of equation (1). The exemplary pseudo code 1200 comprises a first portion 1204 to compute a magnitude of the input x. In line 1206, the look-up table for an individual non-linear instruction $f_{m,l}$ in the m×l array can be loaded into a register. Thereafter, the exemplary pseudo code 1200 comprises a portion 1208 to implement equation (1) (e.g., input samples, perform a square operation on the samples, compute the non-linear function and then multiply accumulate the result).

Figure 12A:
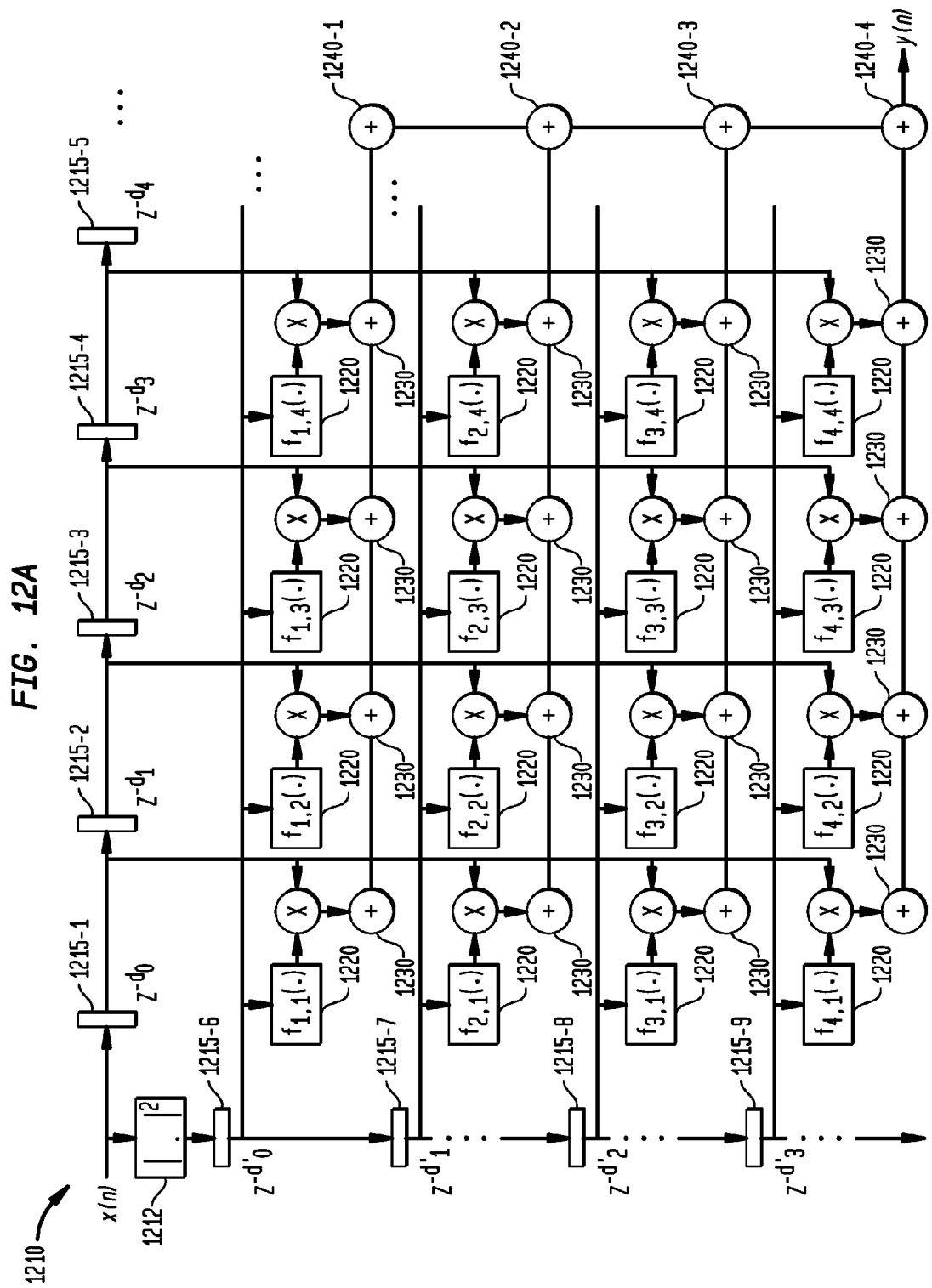
FIG. 12A is a graphical illustration of an exemplary functional block diagram for said user-defined non-linear instruction $f_{m,l}$.

FIG. 12A is a graphical illustration of an exemplary functional block diagram 1210 that implements equation (1). In the exemplary embodiments described herein, $|x|^{2k}$ is used instead of $|x|^k$. As shown in FIG. 12A, the exemplary circuit 1210 comprises a plurality of delay elements, such as delay elements 1215-1 through 1215-5 to generate the x(n−m) term of equation (1) and delay elements 1215-6 through 1215-9 to generate the $|x(n-l)|^2$ term of equation (2) by delaying the output of a squaring operation 1212. In addition, the exemplary functional block diagram 1210 comprises an array of functional units 1220-1,1 through 1220-4,4 that receive the appropriate $|x(n-l)|^2$ term and implements equation (2). The exemplary functional block diagram 1210 also comprises a plurality of multipliers (x) that receive the appropriate x(n−m) term and multiply it with the output of the corresponding m,l functional unit 1220. The outputs of the multiplication in each row are added by adders (+) 1230 and the outputs of each adder 1230 in a given row are summed by a corresponding adder 1240 to generate the output y(n).

Figure 12B:
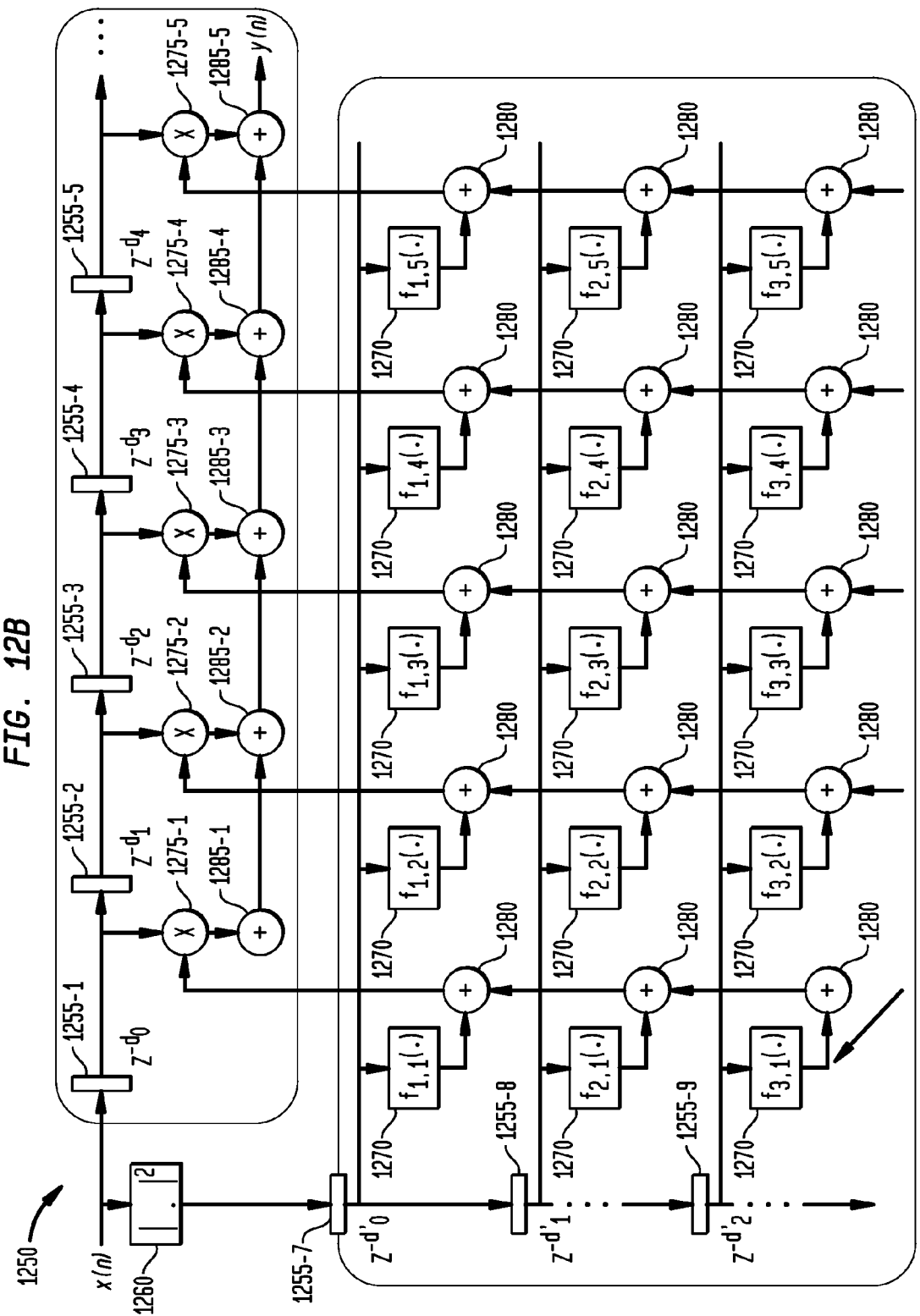
FIG. 12B is a graphical illustration of an exemplary alternate functional block diagram for said user-defined non-linear instruction $f_{m,l}$.

FIG. 12B provides a graphical illustration of an alternate exemplary functional block diagram 1250 that implements equation (1) with a reduced number of multiply operations. As shown in FIG. 12B, the exemplary circuit 1250 comprises a plurality of delay elements, such as delay elements 1255-1 through 1255-5 to generate the x(n−m) term of equation (1) and delay elements 1255-7 through 1255-9 to generate the $|x(n-l)|^2$ term of equation (2) by delaying the output of a squaring operation 1260. In addition, the exemplary functional block diagram 1250 comprises an array of functional units 1270-1,1 through 1270-4,4 that receive the appropriate $|x(n-l)|^2$ term and implements equation (2). Adders 1280 compute the non-linear gains (sum of non-linear functions of magnitude of the input).

The exemplary functional block diagram 1250 also comprises a plurality of multipliers (x) 1275 that receive the appropriate x(n−m) term and multiply it with the output of the summed output of a column of corresponding m,l functional units 1270. In this manner, the non-linear gains from adders 1280 are applied to the input data (complex multiply-accumulate (CMAC) operations). The outputs of the multiplication added by adders (+) 1285 to generate the output y(n).

Figure 13A:
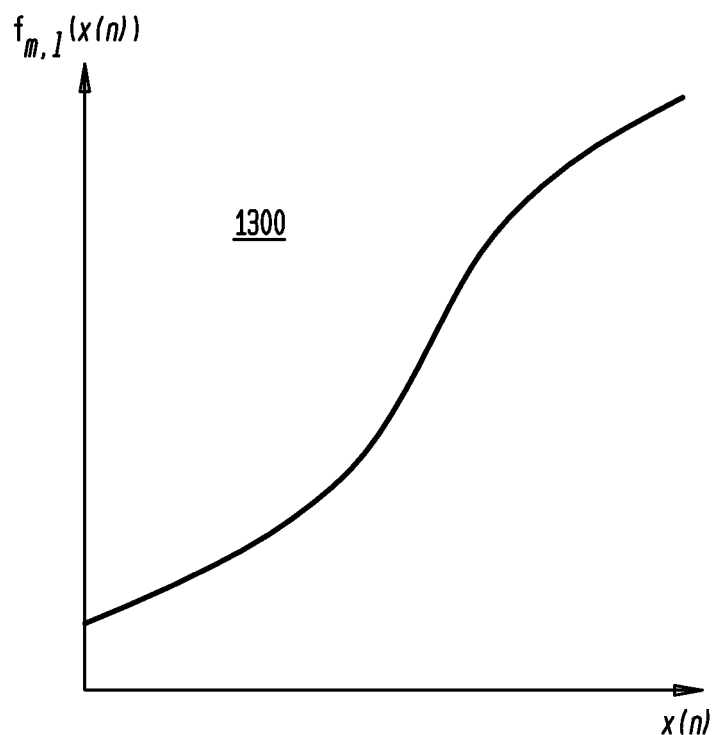
FIG. 13A illustrates an individual user-defined non-linear function $f_{m,l}$ as a function of x(n)
Figure 13B:
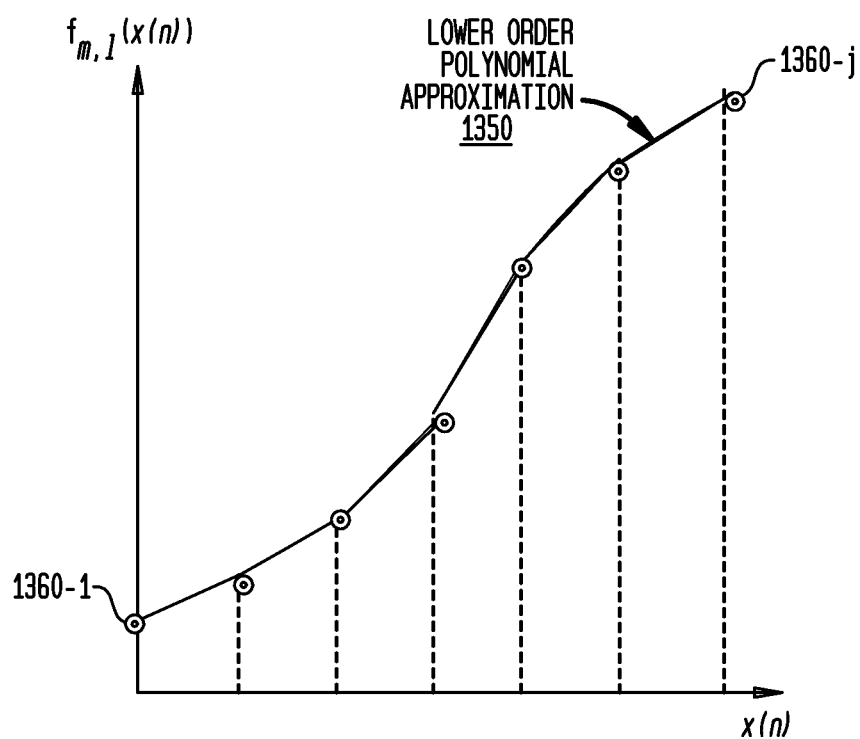
FIG. 13B illustrates an exemplary approximation of the individual user-defined non-linear function $f_{m,l}$ of FIG. 13A.

FIG. 13A illustrates an individual user-defined non-linear function $f_{m,l}$ 1300 as a function of x(n). FIG. 13B illustrates an exemplary approximation 1350 of the individual user-defined non-linear function $f_{m,l}$ of FIG. 13A. The exemplary approximation 1350 of FIG. 13B uses segmented Taylor series look-up tables. The non-linear function $f_{m,l}$ 1300 is decomposed into j segments. The samples 1360-1 through 1360-j associated with each segment is stored in a look-up table. If a sample is stored in the look-up table for a given x, the sample can be retrieved from the look-up table and directly employed in the non-linear function evaluation. If a desired x is between 2 values in the look-up table, then a linear interpolation or more generally a Taylor series-based interpolation is performed in hardware within the functional unit to obtain the result, as discussed further below in conjunction with FIG. 15. In this manner, the non-linear digital pre-distortion operation can be described by Taylor series coefficients in different segments of the input signal 1350. In one exemplary implementation having 32 segments, for coefficients represented using 4 Cubic polynomial approximations coefficients, in the look-up table there are 128 complex entries (16 bit complex and 16 bit real). In a further variation having 128 segments, and one coefficient per segment, there are 128 complex coefficients for linear interpolation (16 bit complex and 16 bit real).

As indicated above, if a desired x value is not in the look-up table but rather is in between 2 values in the look-up table, then a linear interpolation is performed in hardware within the functional unit to obtain the result. A Taylor series computation can be performed as a cubic interpolation to evaluate the small cubic polynomial, as follows:

$$f(\epsilon)=a_0+a_1\cdot\epsilon+a_2\cdot\epsilon^2+a_3\cdot\epsilon^3$$

where the coefficients a are obtained from the look-up table. The complexity of this expression, however, is significant (with a number of multipliers to perform the multiplications and squaring operations).

The complexity can be reduced using the Horner algorithm (factorization), such that $f(\epsilon)$ can be computed as follows. See, also, U.S. patent application Ser. No. 12/324,934, filed Nov. 28, 2008, entitled "Digital Signal Processor With One Or More Non-Linear Functions Using Factorized Polynomial Interpolation," incorporated by reference herein.

$$f(\epsilon)=((b_3\cdot\epsilon+b_2)\cdot\epsilon+b_1)\cdot\epsilon+b_0 \quad (3)$$

The complexity in equation (3) has been reduced to only 3 multiplication and 3 addition operations. $f(\epsilon)$ is an offset from the value stored in the look-up table.

Figure 14:
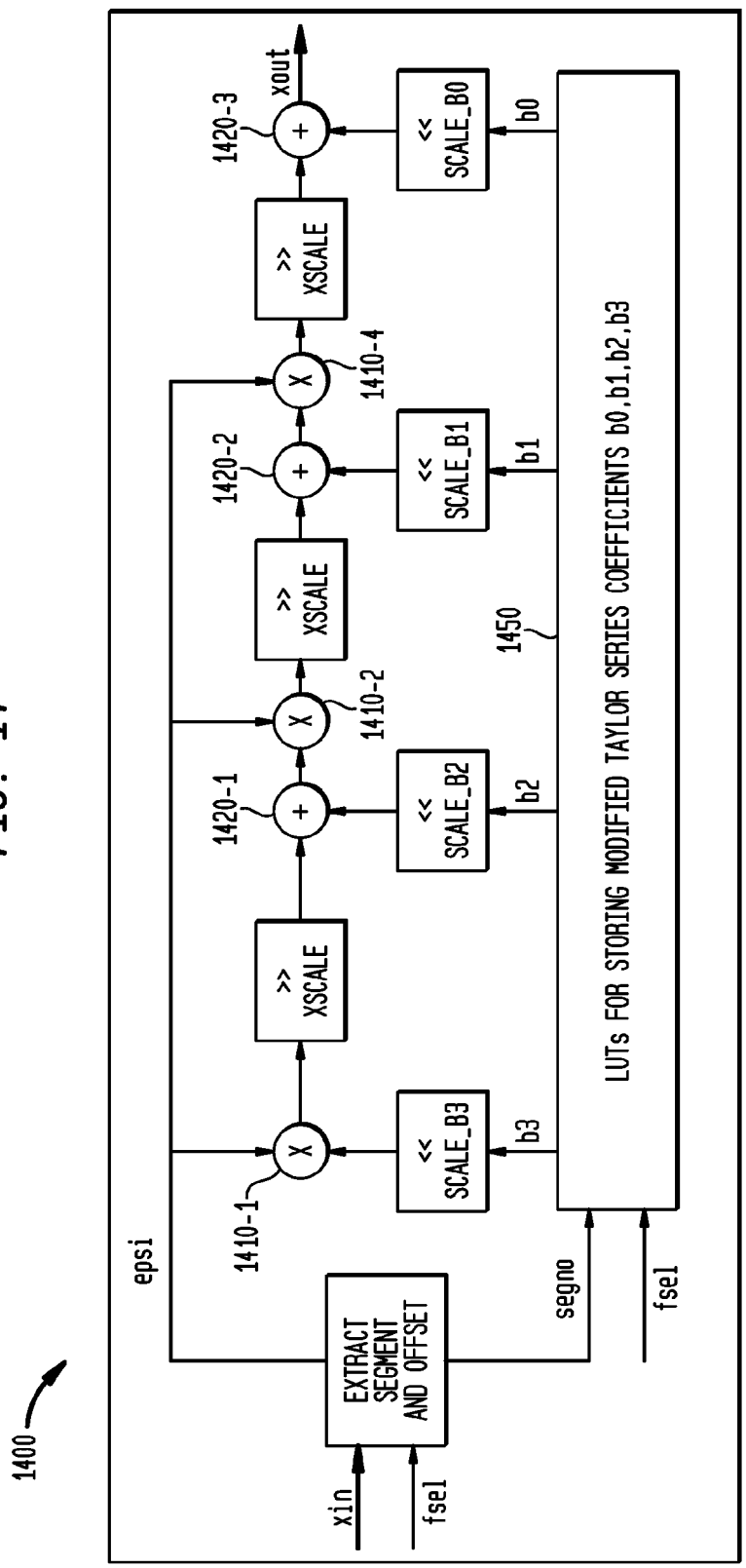
FIG. 14 illustrates a Taylor Sum computation block.

FIG. 14 illustrates a Taylor Sum computation block 1400 that implements equation (3). The coefficients $b_0$, $b_1$, $b_2$, $b_3$ are retrieved from the look-up table 1450. The Taylor Sum computation block 1400 implements equation (3) with only 3 multiplication (1410) operations and 3 addition (1420) operations.

Figure 15:
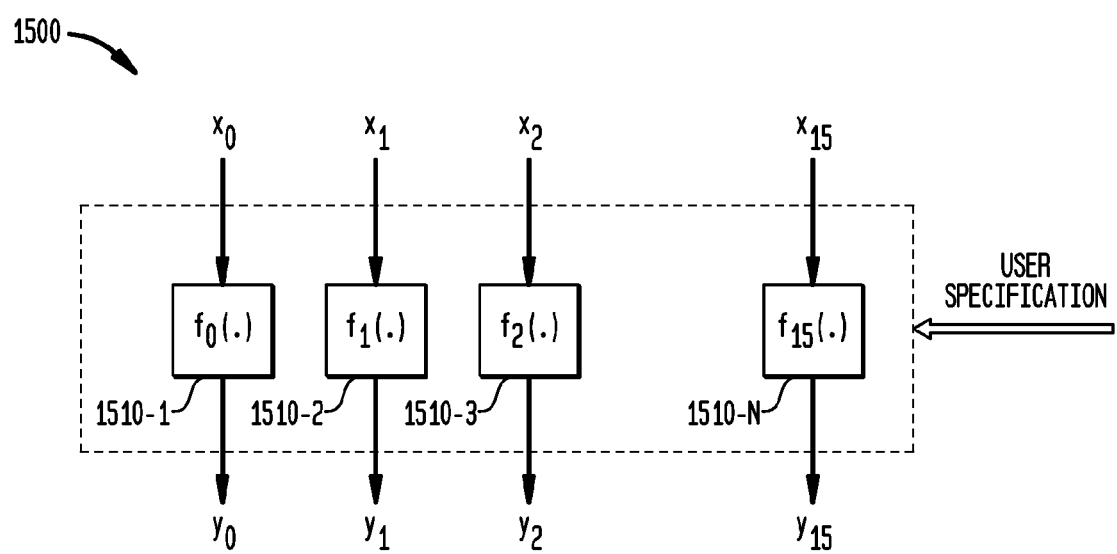
FIG. 15 is a schematic block diagram of an exemplary vector-based digital processor that evaluates a user-defined non-linear function for one or more complex numbers simultaneously in accordance with an embodiment of the present invention.

FIG. 15 is a schematic block diagram of an exemplary vector-based digital processor 1500 that evaluates a user-defined non-linear function for one or more complex numbers simultaneously in accordance with an embodiment of the present invention. Generally, the vector-based implementation of FIG. 15 performs different operations concurrently. Thus, the vector-based digital processor 1500 contains plural functional units 1510-1 through 1510-N for evaluating user-defined non-linear functions.

Generally, the vector-based digital processor 1500 processes a vector of inputs x and generates a vector of outputs, y(n). The exemplary vector-based digital processor 1500 is shown for a 16-way vector processor nl instruction implemented as:

vec_nl (x1,x2, . . . , x16), range of x[k] from 0 to 1

In this manner, the vector-based digital processor 1500 can perform 16 such non-linear operations and linearly combine them in a single cycle. For example, the user-defined non-linear function can be expressed as:

$$f(x) = \sum_{k=0}^{15} a_k x^k$$

It is noted that in the more general case, different functions $f_0(\ ), f_1(\ ), \ldots, f_{15}(\ )$ may be applied to each component of the vector data of the vector processor.

As shown in FIG. 15, the functional units 1510 receive the user-specification, such as the look-up tables or coefficients, from memory for storage in a register.

DPD Parameter Estimation 160

As indicated above, the digital signal from the analog-to-digital converter (ADC) is stored in an on-chip memory 170 for DPD parameter estimation 160. As discussed hereinafter, DPD parameter estimation involves computing matrices containing non-linear terms such as $x \cdot |y|^k$. Envelope operations involve vector operations of the type x*conj(x) and vector sqrt( )which can be accelerated using a vector processor. Multiplication of matrices can use vector multiplication, addition and reduction. Convolution can be accelerated using a vector convolution instruction FIG. 16 is a schematic diagram of a first system 1600 for adaptive pre-distortion. Generally, adaptive pre-distortion 1610 is achieved using an inverse model of the power amplifier 1620. The pre-distortion stage 1610 can be implemented in the manner described above for the DPD 130 of FIG. 1. First, the inverse amplifier model is identified by an estimation algorithm 1650 using the output of the amplifier 1620 to estimate its input. An adaptive filter 1640 should produce a signal $\hat{x}(n)$ that should be equivalent to the output of the pre-distortion stage 1610 following a delay 1625. Thus, the estimation algorithm 1650 aims to minimize the error computed by adder 1630.

Thereafter, the coefficients w of the inverse model generated by the estimation algorithm 1650 are copied to pre-distorter 1610 to pre-distort the input to the amplifier 1620.

Figure 17:
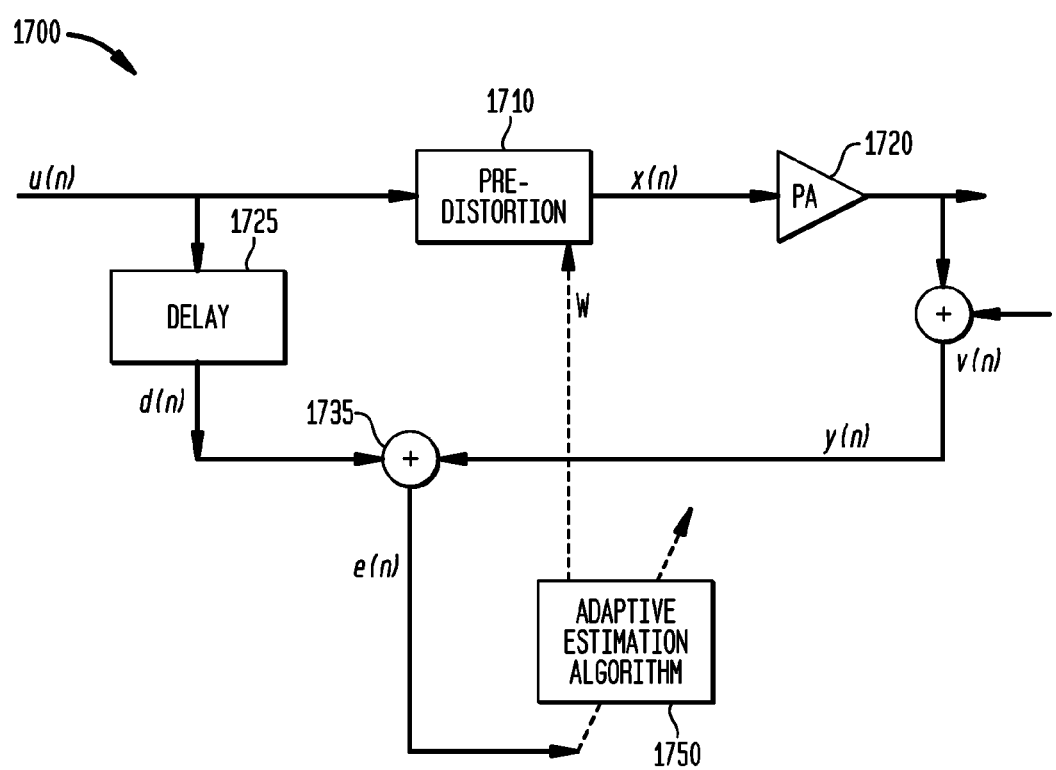
FIG. 17 is a schematic diagram of a direct form system for adaptive pre-distortion.

FIG. 17 is a schematic diagram of a direct form system 1700 for adaptive pre-distortion. Generally, adaptive pre-distortion 1710 is achieved using an inverse model of the power amplifier 1720. The pre-distortion stage 1710 can be implemented in the manner described above for the DPD 130 of FIG. 1. First, the inverse amplifier model is identified by an adaptive estimation algorithm 1750 using the output of the amplifier 1720 to estimate its input. A signal y(n) that should be equivalent to the delayed input of the pre-distortion stage 1710 following a delay 1725. Thus, the adaptive estimation algorithm 1750 aims to minimize the error computed by adder 1735.

Thereafter, the coefficients w of the inverse model generated by the estimation algorithm 1750 are provided to pre-distorter 1710 to pre-distort the input to the amplifier 1720.

The DFE output can be expressed as z(n) and the observation signal PA feedback receiver input can be expressed as y(n). The inverse model of the power amplifier 1620, 1720 is desired. Correlations are needed for all, r, p and q:

$$C(r, p, q) = E(|y(n-p)|^r y^*(n-q) \cdot z(n))$$

$$C(r, p, q) = E\left(|y(n-p)|^r y^*(n-q) \cdot \sum_{m=0}^{M-1} \sum_{l=0}^{M-1} \sum_{k=0}^{K-1} h_{k,m,l} |y(n-1)|^k y(n-m)\right)$$

where $h_{k,m,l}$, are the desired coefficients for the inverse model of the power amplifier 1620, 1720.

$$C(r, p, q) = \sum_{m=0}^{M-1} \sum_{l=0}^{M-1} \sum_{k=0}^{K-1} h_{k,m,l} E(|y(n-p)|^r \cdot |y(n-l)|^k y^*(n-q) \cdot y(n-m))$$

So the following must also be computed:

$$B(k,r,l,m,p,q) = E(|y(n-p)|^{r-1} y(n-l)|^k y^*(n-q) \cdot y(n-m))$$

The following is obtained:

$$C(r, p, q) = \sum_{m=0}^{M-1} \sum_{l=0}^{M-1} \sum_{k=0}^{K-1} B(r, k, l, m, p, q) \cdot h_{k,m,l}$$

By re-ordering/renaming indices:

$$C(k) = \sum_{l=0}^{K-1} B(k, l) \cdot h_l$$

h can be computed using a matrix inversion (performed in CPU):

$$h = B^{-1} C$$

h is used for the DPD coefficients.
Estimation of mathematical expectations:

$$c_k = E(y_k^* \cdot z) = \frac{1}{N_s} \sum_{n=0}^{N_s-1} y_k^*(n) \cdot z(n) \rightarrow N_s \cdot N_{taps} \text{ CMACs}$$

$$b_{k,l} = E(y_k^* \cdot y_l) = \frac{1}{N_s} \sum_{n=0}^{N_s-1} y_k^*(n) \cdot y_l(n) \rightarrow N_s \cdot N_{taps}^2 \text{ CMACs}$$

Vector Convolution

Figure 18:
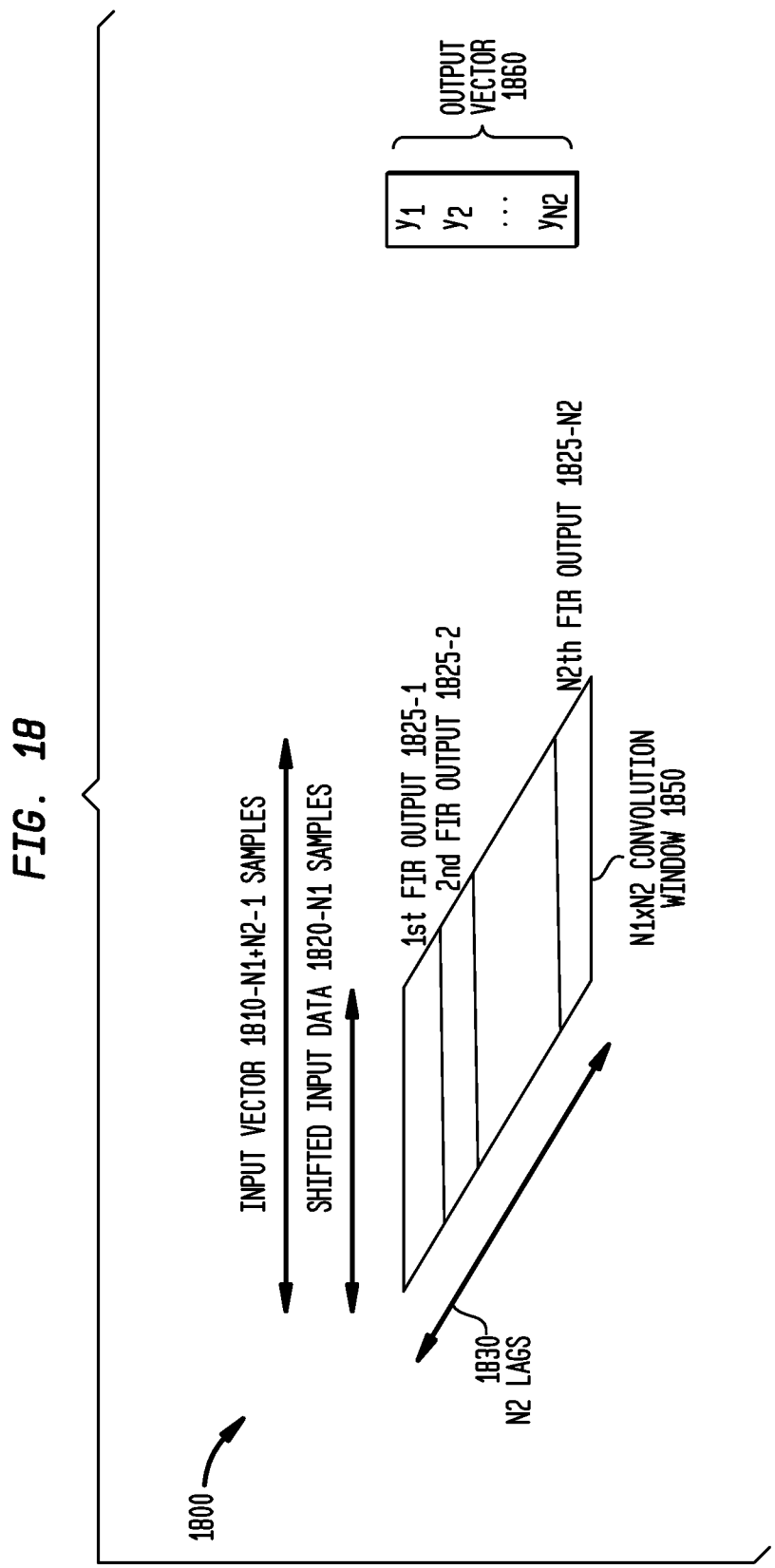
FIG. 18 illustrates a vector convolution function that may be employed by many of the filtering operations described herein.

FIG. 18 illustrates a vector convolution function 1800 that may be employed by many of the filtering operations described herein. Generally, a vector convolution function 1800 computes the convolution of N-bit complex data (N/2-bit real and N/2-bit imaginary) and complex antipodal data (e.g., coefficients). The vector convolution function 1800 typically receives an input vector of N1+N2−1 samples and processes time shifted versions 1820 of N1 samples of the input vector 1810 N1 (along an axis 1830) and coefficients, and for each time shifted-version (each time lag, including a zero shifted version) produces an FIR output value 1825. An output vector 1860 is comprised of the N2 output values.

In the exemplary embodiment of FIG. 18, the input vector 1810 comprises N1+N2−1 samples of real or complex data (e.g., 32-bit real and 32-bit imaginary) and there N2 time shifted versions 1820 (including a zero shifted version) having N1 samples (16-bit real and 16-bit imaginary) that get convoluted with the coefficients. The coefficients can each be binary values (e.g., or 2 bit, 4 bit, etc).

The disclosed vector convolution function (vec_conv( )) accelerates the FIR filter within the vector convolution function 1800 where the coefficients are, e.g., binary values (such as 2 bit, 4 bit, etc.). Additionally, the operation can be further accelerated and performed in a single cycle using a sufficient number of bits for the coefficient, such as 18 bits. Generally, each time shifted operation comprises an FIR filtering of the shifted input value 1820 and the coefficient.

For an exemplary convolution with 2 bit values, an FIR filter/convolution operation can be written as follows:

$$y(n) = \sum_{k=0}^{N-1} h(k)x(n-k)$$

$$h(k) = \sum_{j=0}^{N_b-1} (h'_{j,k} + 2h''_{j,k}) \cdot 4^j$$

where:

$$h'_{j,k} \in \{0, 1\}$$

and $$h''_{j,k} \in \{0, 1\}$$

$$y(n) = \sum_{j=0}^{N_b-1} 4^j \left( \sum_{k=0}^{N-1} (h'_{j,k} + 2h''_{j,k}) \cdot x(n-k) \right)$$

where h(k) indicates the coefficients and x(n−k) indicates the time shifted input values. In the case of a multi-phase filter, the coefficients $h_k$ can be changed for each phase of the filter.

The convolution of an input signal x by a filter having an impulse response h can be written as follows:

$$y_n = \sum_{k=1}^{Ntaps} h_k x_{n-k}$$

The correlation or cross-correlation of an input signal x with an input signal y can be written as follows (where signal x and/or signal y can be a known reference signal such as a pilot signal or a CDMA binary/bipodal code):

$$c_n = \sum_{k=1}^{N} x_k y_{n+k}$$

For an exemplary convolution with a 12-bit representation of the coefficients, there are 6 iterations to compute the FIR filter output (6 times 2-bit values).

For a more detailed discussion of a convolution instruction for a vector processor, see, for example, International Patent Application Serial No. PCT/US2012/062182, entitled "Vector Processor Having Instruction Set With Vector Convolution Function for FIR Filtering," filed contemporaneously herewith and incorporated by reference herein.

Equalization/IQ Imbalance Correction 140

As indicated above, the equalization/IQ imbalance correction 140 performs IQ correction and employs RF channel equalization to mitigate channel impairments. As discussed hereinafter, RF channel equalization and/or I/Q imbalance correction can be implemented using vector multiplication, addition and reduction or convolution instruction. Likewise, can be implemented using vector multiplication/addition/reduction or correlation instruction. In an exemplary embodiment, RF channel equalization and I/Q imbalance correction are combined in the equalization/IQ imbalance correction 140.

Figure 19:
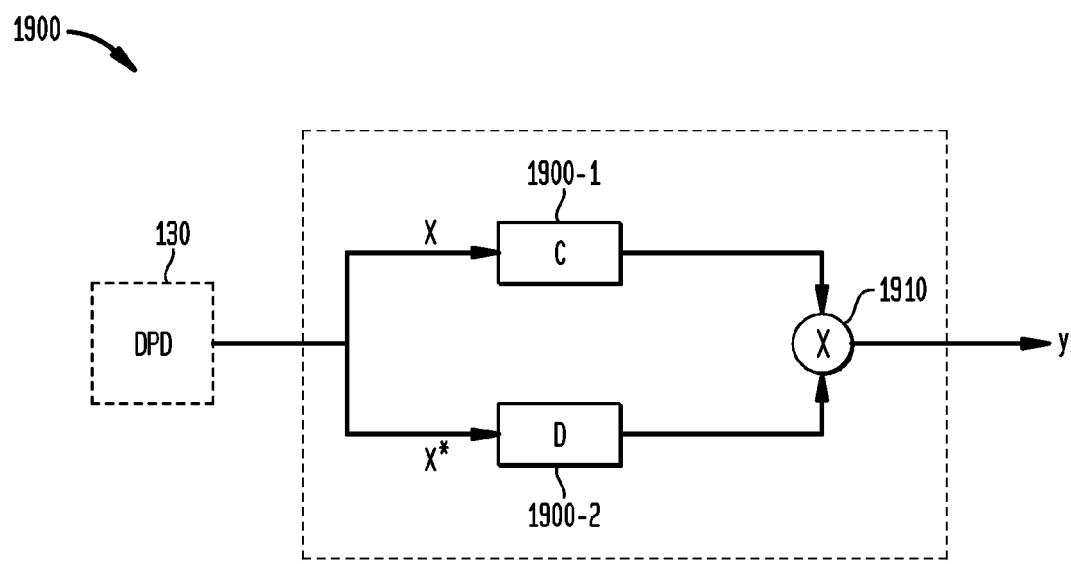
FIG. 19 is a schematic block diagram of an exemplary equalization/IQ imbalance correction (IQIC) stage that can be used to implement the IQ/Equalization block of FIG. 1.

FIG. 19 is a schematic block diagram of an exemplary equalization/IQ imbalance correction (IQIC) stage 1900 that can be used to implement the IQ/Eq. block 140 of FIG. 1. As shown in FIG. 19, the combined RF equalizer and IQ imbalance correction (IQIC) stage 300 can be implemented as two parallel FIR filters 1900-1, 1900-2 as follows:

$$y_n = \sum_{k=1}^{N} a_k \cdot x_{n-k} + \sum_{k=1}^{N} b_k \cdot x_{n-k}^* \qquad (4)$$

For example, each FIR filter 1900 can be implemented as an FIR filter having 32 taps at a sampling rate of 307.2 MSPS. The two parallel FIR filters 1900-1, 1900-2 can have complex inputs and complex coefficients. In the exemplary embodiment of FIG. 19, the input signal x is applied to the first FIR filter 1900-1 and the conjugate x* of the input signal x is applied to the second FIR filter 1900-2. Thus, IQ imbalance correction can be represented as 2 complex filters 1900 with outputs combined by an adder 1910.

Thus, frequency-dependent I/Q imbalance correction is performed using two FIR filters with input x and conjugate of x where x is the input to I/Q imbalance correction processing.

The combined RF equalizer and IQ imbalance correction (IQIC) stage 1900 can be implemented in hardware or in software using the convolution instruction in a vector processor, as discussed further above in conjunction with FIG. 18.

Channel Filters/Channel Digital Down Conversion (DDC) Block 180

The channel filters/channel digital down conversion (DDC) block 180 can be implemented in a similar manner as the channel filter and digital up conversion stage 110 of FIG. 1 to perform channel filtering in the receive path using, for example, finite impulse response (FIR) filters and digital down conversion to convert a radio frequency (RF) to a digitized baseband signal.

Incorporated Applications

For a more detailed discussion of a number of the non-linear functions and other functions discussed herein, see, for example, U.S. patent application Ser. No. 12/324,926, filed Nov. 28, 2008, entitled "Digital Signal Processor Having Instruction Set with One or More Non-Linear Complex Functions;" U.S. patent application Ser. No. 12/324,927, filed Nov. 28, 2008, entitled "Digital Signal Processor Having Instruction Set With One Or More Non-Linear Functions Using Reduced Look-Up Table;" U.S. patent application Ser. No. 12/324,934, filed Jan. 8, 2008, entitled "Digital Signal Processor With One Or More Non-Linear Functions Using Factorized Polynomial Interpolation;" U.S. patent application Ser. No. 12/362,874, filed Jan. 30, 2009, entitled "Digital Signal Processor Having Instruction Set With An Xk Function Using Reduced Look-Up Table;" U.S. patent application Ser. No. 12/849142, filed Aug. 3, 2010, entitled "System and Method for Providing Memory Bandwidth Efficient Correlation Acceleration;" and/or Lei Ding et al., "Compensation of Frequency-Dependent Gain/Phase Imbalance in Predistortion Linearization Systems," IEEE Transactions on Circuits and Systems, Vol. 55, No. 1, 390-97 (February 2008), each incorporated by reference herein.

Conclusion

While exemplary embodiments of the present invention have been described with respect to digital logic blocks and memory tables within a digital processor, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may he embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. A method for performing a vector convolution function on a signal in software, comprising:
   receiving, by a processor, the signal, wherein the signal comprises a plurality of data samples, and
   performing, by the processor, the vector convolution function on the signal and a plurality of coefficients by executing, in response to a single software instruction, a single instruction of a hardware instruction set of the processor, wherein the single instruction comprises a vector convolution instruction,
   wherein performing the vector convolution function comprises producing, for each of a plurality of time shifts, a finite impulse response output value based on the plurality of data samples and the plurality of coefficients,
   wherein producing, for each of the plurality of time shifts, the finite impulse response output value comprises to produce, for each of the plurality of time shifts, only a portion of the finite impulse response output value based on the plurality of data samples and only a portion of each coefficient of the plurality of coefficients in one clock cycle of the processor.

2. The method of claim 1, wherein said processor comprises one or more of a digital signal processor or a vector processor.

3. The method of claim 1, wherein a plurality of signals from a plurality of processors are each processed on a separate processor.

4. The method of claim 1, further comprising performing, by the processor, a complex exponential function on the signal by executing, in response to a single complex exponentiation software instruction, a single complex exponentiation instruction of the hardware instruction set.

5. The method of claim 1 further comprising performing, by the processor, an $x^k$ function on the signal by executing, in response to a single $x^k$ software instruction, a single $x^k$ instruction of the hardware instruction set.

6. The method of claim 1, further comprising performing, by the processor, a digital up conversion function that multiplies said signal by a complex exponential by executing, in response to a single up conversion software instruction, a single up conversion instruction of the hardware instruction set.

7. The method of claim 1 further comprising performing, by the processor, one or more user-defined non-linear instructions.

8. The method of claim 7, wherein said one or more user-defined non-linear instructions comprise at least one user-specified parameter.

9. The method of claim 8, wherein performing, by the processor, the one or more user defined non-linear instructions comprises:
   invoking at least one functional unit that applies said non-linear function to an input value, x; and
   generating an output corresponding to said non-linear function for said input value, x.

10. The method of claim 8, further comprising the step of loading said at least one user-specified parameter from memory into at least one register.

11. The method of claim 8, wherein said user-specified parameter comprises a look-up table storing values of said non-linear function for a finite number of input values.

12. The method of claim 1, wherein only the portion of each coefficient of the plurality of coefficients comprises only the first two bits of each coefficient of the plurality of coefficients, wherein each coefficient of the plurality of coefficients comprises more than two bits.

13. A processor for performing a vector convolution function on a signal in software, comprising:
    a memory; and
    at least one hardware device, coupled to the memory, operative to:
      receive, by the at least one hardware device, the signal, wherein the signal comprises a plurality of data samples, and
      perform, by the at least one hardware device, the vector convolution function on the signal and a plurality of coefficients by executing, in response to a single software instruction, a single instruction of a hardware instruction set of the processor, wherein the single instruction comprises a vector convolution instruction, wherein to perform the vector convolution function comprises to produce, for each of a plurality of time shifts, a finite impulse response output value based on the plurality of data samples and the plurality of coefficients,
      wherein to produce, for each of the plurality of time shifts, the finite impulse response output value comprises to produce, for each of the plurality of time shifts, only a portion of the finite impulse response output value based on the plurality of data samples and only a portion of each coefficient of the plurality of coefficients in one clock cycle of the at least one hardware device.

14. The processor of claim 13, wherein only the portion of each coefficient of the plurality of coefficients comprises only the first two bits of each coefficient of the plurality of coefficients, wherein each coefficient of the plurality of coefficients comprises more than two bits.

15. The processor of claim 13, wherein said processor comprises one or more of a digital signal processor or a vector processor.

16. The processor of claim 13, wherein a plurality of signals from a plurality of processors are each processed on a separate processor.

17. The processor of claim 13, wherein the hardware device is further to perform a complex exponential function on the signal by executing, in response to a single complex exponentiation software instruction, a single complex exponentiation instruction of the hardware instruction set of the processor.

18. The processor of claim 13, wherein the hardware device is further to perform an $x^k$ function on the signal by executing, in response to a single $x^k$ software instruction, a single $x^k$ instruction of the hardware instruction set of the processor.

19. The processor of claim 13, wherein the hardware device is further to perform a digital up conversion function that multiplies said signal by a complex exponential signal by executing, in response to a single up conversion software instruction, a single up conversion instruction of the hardware instruction set of the processor.

20. The processor of claim 13, wherein the hardware device is further to perform one or more user-defined non-linear instructions.

21. The processor of claim 20, wherein the one or more user-defined non-linear instructions comprises at least one user-specified parameter.

22. The processor of claim 21, wherein to perform the one or more user defined non-linear instructions comprises to:
 invoke at least one functional unit that implements applies the non-linear function to an input value x; and
 generate an output corresponding to the non-linear function for the input value x.

23. The processor of claim 21, wherein the hardware device is further to load the at least one user-specified parameter into at least one register.

24. The processor of claim 21, wherein the at least one user-specified parameter comprises a look-up table storing values of said non-linear function for a finite number of input values.

25. One or more non-transitory computer readable media comprising a plurality of instructions stored thereon that, when executed by at least one hardware device, causes the at least one hardware device to:
 receive a signal, wherein the signal comprises a plurality of data samples;
 perform a vector convolution function on the signal and a plurality of coefficients by executing, in response to a single software instruction, a single instruction of a hardware instruction set of the at least one hardware device, wherein the single instruction comprises a vector convolution instruction, wherein to perform the vector convolution function comprises to produce, for each of a plurality of time shifts, a finite impulse response output value based on the plurality of data samples and the plurality of coefficients,
 wherein to produce, for each of the plurality of time shifts, the finite impulse response output value comprises to produce, for each of the plurality of time shifts, only a portion of the finite impulse response output value based on the plurality of data samples and only a portion of each coefficient of the plurality of coefficients in one clock cycle of the at least one hardware device.

26. The one or more non-transitory computer-readable storage media of claim 25, wherein only the portion of each coefficient of the plurality of coefficients comprises only the first two bits of each coefficient of the plurality of coefficients, wherein each coefficient of the plurality of coefficients comprises more than two bits.

27. The one or more non-transitory computer-readable storage media of claim 25, wherein the plurality of instructions further causes the hardware device to perform a complex exponential function on the signal by executing, in response to a single complex exponentiation software instruction, a single complex exponentiation instruction of the hardware instruction set.

28. The one or more non-transitory computer-readable storage media of claim 25, wherein the plurality of instructions further causes the hardware device to perform an $x^k$ function on the signal by executing, in response to a single $x^k$ software instruction, a single $x^k$ instruction of the hardware instruction set.

29. The one or more non-transitory computer-readable storage media of claim 25, wherein the plurality of instructions further causes the hardware device to perform a digital up conversion function that multiplies said signal by a complex exponential signal by executing, in response to a single up conversion software instruction, a single up conversion instruction of the hardware instruction set.

30. The one or more non-transitory computer-readable storage media of claim 25, wherein the plurality of instructions further causes the hardware device to perform one or more user-defined non-linear instructions.

31. The one or more non-transitory computer-readable storage media of claim 30, wherein the one or more user-defined non-linear instructions comprises at least one user-specified parameter.

32. The one or more non-transitory computer-readable storage media of claim 31, wherein to perform the one or more user defined non-linear instructions comprises to:
 invoke at least one functional unit that implements applies the non-linear function to an input value x; and
 generate an output corresponding to the non-linear function for the input value x.

33. The one or more non-transitory computer-readable storage media of claim 31, wherein the plurality of instructions further causes the hardware device to load the at least one user-specified parameter into at least one register.

34. The one or more non-transitory computer-readable storage media of claim 31, wherein the at least one user-specified parameter comprises a look-up table storing values of said non-linear function for a finite number of input values.

* * * * *